(12) United States Patent
Woo et al.

(10) Patent No.: US 12,100,469 B2
(45) Date of Patent: Sep. 24, 2024

(54) RECEIVER RECEIVING MULTI-LEVEL SIGNAL, MEMORY DEVICE INCLUDING THE SAME AND METHOD OF RECEIVING DATA USING THE SAME

(71) Applicant: Samsung Electronics Co., Ltd., Suwon-si (KR)

(72) Inventors: Byungsuk Woo, Hwaseong-si (KR); Sucheol Lee, Suwon-si (KR); Changkyu Seol, Osan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 165 days.

(21) Appl. No.: 17/962,992

(22) Filed: Oct. 10, 2022

(65) Prior Publication Data
US 2023/0033286 A1    Feb. 2, 2023

Related U.S. Application Data

(63) Continuation of application No. 17/463,635, filed on Sep. 1, 2021, now Pat. No. 11,495,271.

(30) Foreign Application Priority Data

Jan. 6, 2021    (KR) .................. 10-2021-0001264

(51) Int. Cl.
*G11C 7/10* (2006.01)
*G11C 7/04* (2006.01)
*G11C 7/14* (2006.01)

(52) U.S. Cl.
CPC .............. *G11C 7/1063* (2013.01); *G11C 7/04* (2013.01); *G11C 7/1045* (2013.01);
(Continued)

(58) Field of Classification Search
CPC ... G11C 7/1063; G11C 7/1045; G11C 7/1069; G11C 7/1096; G11C 7/14
See application file for complete search history.

(56) References Cited

U.S. PATENT DOCUMENTS 7,519,130 B2 *  4/2009  Hsu .................... H04L 25/0274
                                                    327/107
7,924,046 B1 *  4/2011  Ding .................. H04L 25/0286
                                                    326/26

(Continued)

FOREIGN PATENT DOCUMENTS

| JP | 2018133760 A | 8/2018 |
| JP | 6597295 B2 | 10/2019 |
| KR | 1020200001198 A | 1/2020 |

*Primary Examiner* — Jason Lappas
(74) *Attorney, Agent, or Firm* — Muir Patent Law, PLLC

(57) ABSTRACT

A receiver that receives a multi-level signal includes a compensation circuit, a sampling circuit, an output circuit and a mode selector. The compensation circuit generates a plurality of data signals and a plurality of reference voltages by compensating intersymbol interference on an input data signal. The sampling circuit generates a plurality of sample signals based on the plurality of data signals and the plurality of reference voltages. The output circuit generates output data based on the plurality of sample signals, and selects a current value of the output data based on a previous value of the output data. The mode selector generates a mode selection signal used to select one of first and second operation modes based on an operating environment. The compensation circuit and the sampling circuit are entirely enabled in the first operation mode, and the compensation circuit and the sampling circuit are partially enabled in the second operation mode.

20 Claims, 28 Drawing Sheets

(52) U.S. Cl.
CPC .......... *G11C 7/1069* (2013.01); *G11C 7/1096* (2013.01); *G11C 7/14* (2013.01)

(56) References Cited

U.S. PATENT DOCUMENTS

| | | | |
|---|---|---|---|
| 7,936,812 B2 * | 5/2011 | Hollis | H04L 25/03057 375/233 |
| 8,091,008 B2 * | 1/2012 | Oku | G11C 7/106 714/766 |
| 8,112,680 B2 * | 2/2012 | Chung | G11C 7/1006 714/701 |
| 8,385,492 B2 * | 2/2013 | Ho | H04L 25/03057 375/340 |
| 8,624,653 B2 * | 1/2014 | Nagda | G01R 31/31703 327/307 |
| 9,379,920 B1 | 6/2016 | Liao et al. | |
| 9,800,436 B2 | 10/2017 | Sakai | |
| 10,171,273 B2 | 1/2019 | Sakai | |
| 10,341,145 B2 | 7/2019 | Musah et al. | |
| 10,347,358 B2 * | 7/2019 | Kim | G11C 29/022 |
| 10,523,204 B2 * | 12/2019 | Koo | G11C 7/10 |
| 10,673,562 B2 | 6/2020 | Lee et al. | |
| 2014/0369398 A1 | 12/2014 | Yu et al. | |
| 2020/0007362 A1 | 1/2020 | Kim et al. | |
| 2020/0058332 A1 * | 2/2020 | Choi | G11C 8/06 |
| 2020/0125505 A1 * | 4/2020 | Brox | G11C 7/1084 |
| 2022/0191069 A1 * | 6/2022 | Dong | H04L 25/03019 |

* cited by examiner

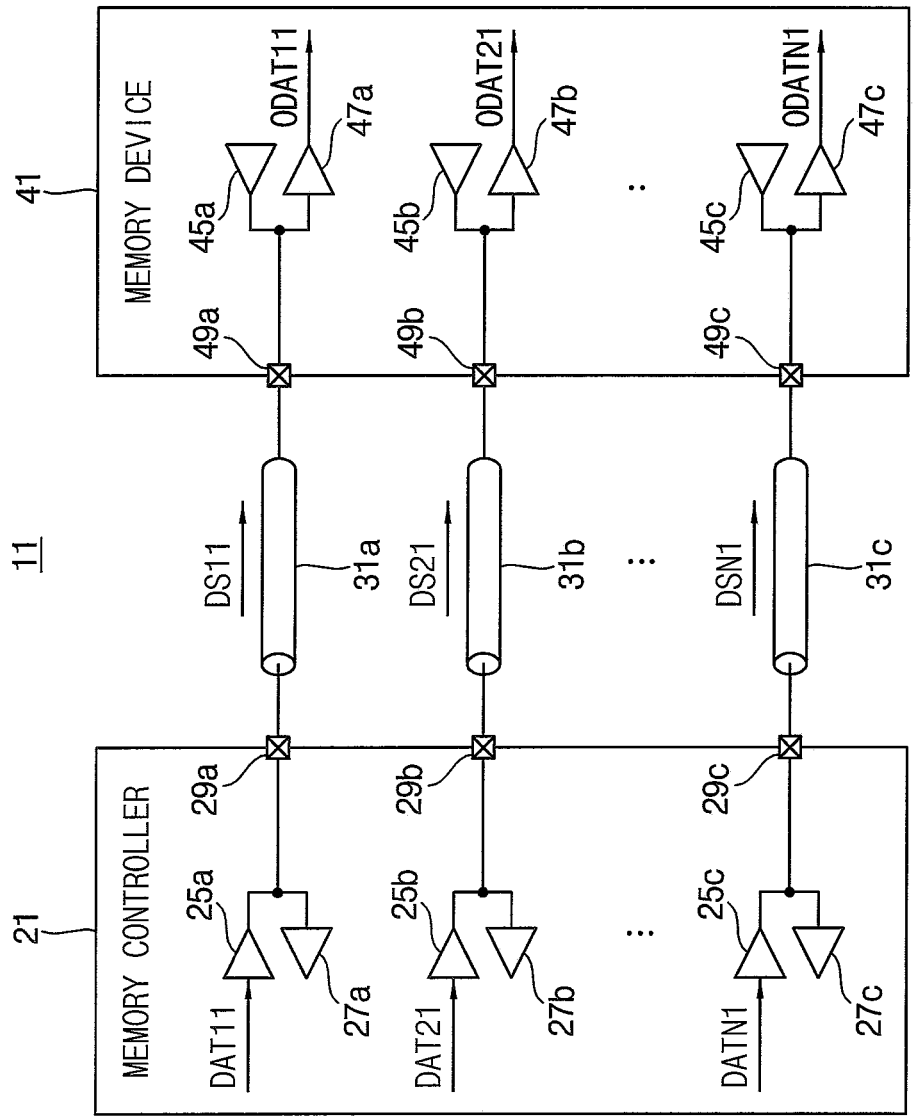

FIG. 11C

| DATA_PRE | | | | VREF_CHANGE (MODE1) | | |
|---|---|---|---|---|---|---|
| DATA | VOH | VOM | VOL | VREF_H | VREF_M | VREF_L |
| 00 | 0 | 0 | 0 | --- | -- | - |
| 01 | 0 | 0 | 1 | -- | - | + |
| 11 | 0 | 1 | 1 | - | + | ++ |
| 10 | 1 | 1 | 1 | + | ++ | +++ |

FIG. 12C

| DATA_PRE | | | | VREF_CHANGE (MODE2) | | |
| --- | --- | --- | --- | --- | --- | --- |
| DATA | VOH | VOM | VOL | VREF_H | VREF_M | VREF_L |
| 00 | 0 | 0 | 0 | − | − | − |
| 01 | 0 | 0 | 1 | | | |
| 11 | 0 | 1 | 1 | | + | + |
| 10 | 1 | 1 | 1 | + | | |

US 12,100,469 B2

RECEIVER RECEIVING MULTI-LEVEL SIGNAL, MEMORY DEVICE INCLUDING THE SAME AND METHOD OF RECEIVING DATA USING THE SAME

CROSS-REFERENCE TO RELATED APPLICATION

This application is a continuation application of U.S. application Ser. No. 17/463,635, filed Sep. 1, 2021, which claims priority under 35 USC § 119 to Korean Patent Application No. 10-2021-0001264 filed on Jan. 6, 2021 in the Korean Intellectual Property Office (KIPO), the contents of each of which are herein incorporated by reference in their entirety.

BACKGROUND

1. Technical Field

Example embodiments relate generally to semiconductor integrated circuits, and more particularly to receivers receiving multi-level signals, memory devices including the receivers, and methods of receiving data using the receivers.

2. Description of the Related Art

Semiconductor memory devices can generally be divided into two categories depending upon whether or not they retain stored data when disconnected from a power supply. These categories include volatile memory devices, which lose stored data when disconnected from power, and nonvolatile memory devices, which retain stored data when disconnected from power. Volatile memory devices may perform read and write operations at a high speed, while contents stored therein may be lost at power-off. Nonvolatile memory devices may retain contents stored therein even at power-off, which means they may be used to store data that must be retained regardless of whether they are powered.

Recently, as the performance of semiconductor memory devices has improved, communication speed (or interface speed) between a memory controller and a semiconductor memory device has also increased. Thus, multi-level signaling in which a plurality of bits are transmitted during one unit interval (UI) has been researched.

SUMMARY

At least one example embodiment of the present disclosure provides a receiver capable of increasing timing margin and reducing power consumption while a signal based on multi-level signaling is received.

At least one example embodiment of the present disclosure provides a memory device including the receiver.

At least one example embodiment of the present disclosure provides a method of receiving data using the receiver.

According to example embodiments, a receiver configured to receive a multi-level signal having three or more voltage levels that are different from each other includes a compensation circuit, a sampling circuit, an output circuit and a mode selector. The compensation circuit generates a plurality of data signals and a plurality of reference voltages by compensating intersymbol interference (ISI) on an input data signal that is the multi-level signal. Each of the plurality of reference voltages includes a plurality of compensation reference levels. The sampling circuit generates a plurality of sample signals based on the plurality of data signals and the plurality of reference voltages. Each of the plurality of sample signals includes a plurality of decision values. The output circuit generates output data based on the plurality of sample signals, and selects a current value of the output data based on a previous value of the output data. The output data includes two or more bits that are different from each other. The mode selector generates a mode selection signal used to select one of a first operation mode and a second operation mode based on an operating environment. The compensation circuit and the sampling circuit are entirely enabled in the first operation mode, and the compensation circuit and the sampling circuit are partially enabled in the second operation mode.

According to example embodiments, a memory device includes a receiver and a memory cell array. The receiver receives an input data signal that is a multi-level signal having three or more voltage levels that are different from each other. The memory cell array performs a data write operation based on the input data signal. The receiver includes a compensation circuit, a sampling circuit, an output circuit and a mode selector. The compensation circuit generates a plurality of data signals and a plurality of reference voltages by compensating intersymbol interference (ISI) on the input data signal. Each of the plurality of reference voltages includes a plurality of compensation reference levels. The sampling circuit generates a plurality of sample signals based on the plurality of data signals and the plurality of reference voltages. Each of the plurality of sample signals includes a plurality of decision values. The output circuit generates output data based on the plurality of sample signals, and selects a current value of the output data based on a previous value of the output data. The output data includes two or more bits that are different from each other. The mode selector generates a mode selection signal used to select one of a first operation mode and a second operation mode based on an operating environment. The compensation circuit and the sampling circuit are entirely enabled in the first operation mode, and the compensation circuit and the sampling circuit are partially enabled in the second operation mode.

According to example embodiments, in a method of receiving data based on a multi-level signal having three or more voltage levels that are different from each other, a mode selection signal used to select one of a first operation mode and a second operation mode is generated based on an operating environment. A plurality of data signals and a plurality of reference voltages are generated, by a compensation circuit, by compensating intersymbol interference (ISI) on an input data signal that is the multi-level signal based on the mode selection signal. Each of the plurality of reference voltages includes a plurality of compensation reference levels. A plurality of sample signals are generated, by a sampling circuit, based on the mode selection signal, the plurality of data signals and the plurality of reference voltages. Each of the plurality of sample signals includes a plurality of decision values. Output data is generated based on the plurality of sample signals. The output data includes two or more bits that are different from each other. A current value of the output data is selected based on a previous value of the output data. The compensation circuit and the sampling circuit are entirely enabled in the first operation mode, and the compensation circuit and the sampling circuit are partially enabled in the second operation mode.

According to example embodiments, a receiver configured to receive a multi-level signal having three or more voltage levels that are different from each other includes a compensation circuit, a sampling circuit and an output circuit. The compensation circuit generates a plurality of data signals and a plurality of compensation reference levels by compensating intersymbol interference (ISI) on an input data signal that is the multi-level signal. The sampling circuit generates a plurality of decision values based on the plurality of data signals and the plurality of compensation reference levels. The output circuit generates output data based on the plurality of decision values, and selects a current value of the output data based on a previous value of the output data. The output data includes two or more bits that are different from each other. An equalization is performed on the plurality of compensation reference levels such that all of the plurality of compensation reference levels are changed by a same level. A direction of the equalization is determined based on the previous value of the output data.

According to example embodiments, a receiver configured to receive a multi-level signal having a first voltage level, a second voltage level, a third voltage level and a fourth voltage level that are different from each other includes a compensation circuit, a sampling circuit, an output circuit and a mode selector. The compensation circuit compensates intersymbol interference (ISI) on an input data signal that is the multi-level signal, and includes a first post-cursor canceller, a second post-cursor canceller, a third post-cursor canceller and a fourth post-cursor canceller. The first post-cursor canceller generates a first data signal and first, second and third compensation reference levels. The second post-cursor canceller generates a second data signal and fourth, fifth and sixth compensation reference levels. The third post-cursor canceller generates a third data signal and seventh, eighth and ninth compensation reference levels. The fourth post-cursor canceller generates a fourth data signal and tenth, eleventh and twelfth compensation reference levels. The sampling circuit includes a first slicer, a second slicer, a third slicer and a fourth slicer. The first slicer generates first, second and third decision values by comparing the first data signal with the first, second and third compensation reference levels. The second slicer generates fourth, fifth and sixth decision values by comparing the second data signal with the fourth, fifth and sixth compensation reference levels. The third slicer generates seventh, eighth and ninth decision values by comparing the third data signal with the seventh, eighth and ninth compensation reference levels. The fourth slicer generates tenth, eleventh and twelfth decision values by comparing the fourth data signal with the tenth, eleventh and twelfth compensation reference levels. The output circuit generates output data based on the first through twelfth decision values, and selects a current value of the output data based on a previous value of the output data. The output data includes a most significant bit (MSB) and a least significant bit (LSB). The mode selector selects one of a first operation mode and a second operation mode based on an operating environment. The first through fourth slicers are entirely enabled in the first operation mode, and the first through fourth slicers are partially enabled in the second operation mode.

In the receiver, the memory device and the method of receiving data according to example embodiments, the multi-level signal may be received, and the loop-unrolling structure may be applied or employed. For example, the receiver may be implemented as a dual mode loop-unrolling DFE that operates in one of the first and second operation modes based on the operating environment. In the second operation mode, only a part of the compensation circuit and the sampling circuit included in the receiver may be enabled. Accordingly, the timing margin issue may be improved or enhanced using the loop-unrolling structure, and the power consumption may be reduced by selecting the operation mode based on the operating environment.

BRIEF DESCRIPTION OF THE DRAWINGS

Illustrative, non-limiting example embodiments will be more clearly understood from the following detailed description taken in conjunction with the accompanying drawings.

FIGS. 4A and 4B are block diagrams illustrating an example of a memory system of FIG. 3, according to some embodiments.

FIGS. 11A, 11B, 11C, 12A, 12B and 12C are diagrams for describing an operation of a receiver of FIG. 8, according to some embodiments.

DETAILED DESCRIPTION OF THE EMBODIMENTS

Figure 1:
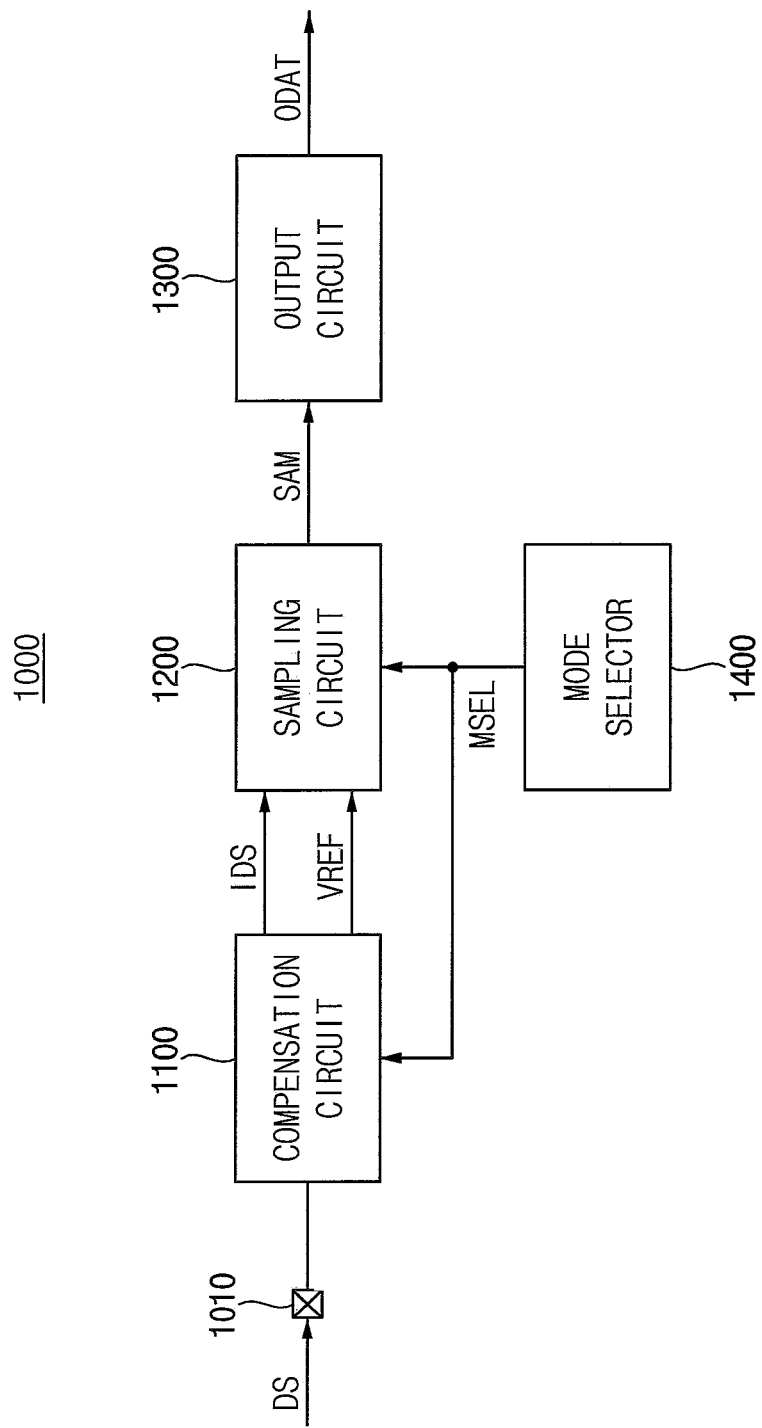
FIG. 1 is a block diagram illustrating a receiver according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating a receiver according to example embodiments.

Referring to FIG. 1, a receiver 1000 includes a compensation circuit 1100, a sampling circuit 1200, an output circuit 1300 and a mode selector 1400. The receiver 1000 may further include a data input pad (or pin) 1010.

The receiver 1000 receives an input data signal DS that is a multi-level signal having three or more voltage levels, and generates output data ODAT that is multi-bit data including two or more bits based on the input data signal DS. For example, the multi-level signal may have one of three or more voltage levels that are different from each other during one unit interval (UI), and the multi-bit data may include two or more bits that are different from each other. The receiver 1000 may be included in various communication systems and/or signal transmission systems, and may be included in, for example, a memory device and/or a memory system. Configurations of the receiver 1000, the memory device, the memory system and the multi-level signal will be described in detail later.

The compensation circuit 1100 generates a plurality of data signals (or intermediate data signals) IDS and a plurality of reference voltages VREF by compensating intersymbol interference (ISI) on the input data signal DS that is the multi-level signal. Each of the plurality of reference voltages VREF includes a plurality of compensation reference levels.

The sampling circuit 1200 generates a plurality of sample signals SAM based on the plurality of data signals IDS and the plurality of reference voltages VREF. Each of the plurality of sample signals SAM includes a plurality of decision values.

In some example embodiments, the compensation circuit 1100 and the sampling circuit 1200 may form a decision feedback equalizer (DFE), and may be implemented in a loop-unrolling structure. Detailed configurations of the compensation circuit 1100 and the sampling circuit 1200 will be described with reference to FIGS. 8 and 13.

In some example embodiments, the compensation circuit 1100 may generate the plurality of compensation reference levels by performing an equalization (or equalizing) technique on a plurality of reference levels. For example, the compensation circuit 1100 may perform a post-cursor cancellation based on a decision feedback equalization, and may be referred to as a post-cursor cancellation circuit. The plurality of reference levels may be used to sense or detect voltage levels of the multi-level signal. When the equalization is performed on the plurality of reference levels, the plurality of compensation reference levels may be generated by adjusting or controlling increasing and/or decreasing directions for the plurality of reference levels and the amount of change in the plurality of reference levels. The equalization will be described with reference to FIGS. 11A, 11B, 11C, 12A, 12B and 12C. For example, the sampling circuit 1200 may perform a decision (or determination) based on an output of the compensation circuit 1100, and may be referred to as a decision circuit or a slicer circuit.

The output circuit 1300 generates the output data ODAT that is the multi-bit data based on the plurality of sample signals SAM, and selects a current value of the output data ODAT based on a previous value of the output data ODAT. For example, the output circuit 1300 may be used to decide or determine an output in the loop-unrolling structure. A detailed configuration of the output circuit 1300 will be described with reference to FIGS. 10 and 14.

The mode selector 1400 generates a mode selection signal MSEL used to select one of a first operation mode and a second operation mode based on an operating environment. The mode selection signal MSEL may be provided to the compensation circuit 1100 and the sampling circuit 1200. The compensation circuit 1100 and the sampling circuit 1200 may be entirely enabled (or activated) in the first operation mode, and the first operation mode may be referred to as a full mode. The compensation circuit 1100 and the sampling circuit 1200 may be partially enabled (or activated) in the second operation mode, and the second operation mode may be referred to as a half mode or a partial mode. A detailed configuration of the mode selector 1400 will be described with reference to FIGS. 2A and 2B.

The data input pad 1010 may be connected to the compensation circuit 1100, and may receive the input data signal DS. For example, a pad may be a contact pad or a contact pin, but example embodiments are not limited thereto, and the data input pad 1010 may be a conductive terminal having other known forms.

In the receiver 1000 according to example embodiments, the input data signal DS that is generated based on a multi-level signaling scheme is received. The multi-level signaling scheme may be used as a means of compressing the bandwidth required to transmit data at a given bit rate. In a simple binary scheme, two single symbols, usually two voltage levels, may be used to represent '1' and '0', and thus the symbol rate may be equal to the bit rate. In contrast, the principle of the multi-level signaling scheme may be to use a larger alphabet of m symbols to represent data, so that each symbol may represent more than one bit of data. As a result, the number of symbols that needs to be transmitted may be less than the number of bits (e.g., the symbol rate may be less than the bit rate), and thus the bandwidth may be compressed. The alphabet of symbols may be constructed from a number of different voltage levels. For example, in a four-level scheme, groups of two data bits may be mapped to one of four symbols. Only one symbol need be transmitted for each pair of data bits, so the symbol rate may be a half of the bit rate.

The multi-level signaling scheme may be used to increase a data transmission (or transfer) rate without increasing the frequency of data transmission and/or a transmission power of the communicated data. An example of one type of the multi-level signaling scheme is a pulse amplitude modulation (PAM) scheme, where a unique symbol of a multi-level signal may represent a plurality of bits of data. The number of possible pulse amplitudes in a digital PAM scheme may be some power of two. For example, there may be $2^2$ possible discrete pulse amplitudes in a 4-level PAM (e.g., in PAM4), there may be $2^3$ possible discrete pulse amplitudes in an 8-level PAM (e.g., in PAM8), and there may be $2^4$ possible discrete pulse amplitudes in a 16-level PAM (e.g., in PAM16). However, example embodiments are not limited thereto, and example embodiments may be applied or employed to an X-level PAM (e.g., PAM(X)) having X possible pulse amplitudes, where X is a natural number greater than or equal to three.

In a general data input/output (I/O) interface, a data signal is transmitted to a receiver through a channel. Recently, as the data rate increases, interference signals due to the channel influence may increase, and thus the characteristic and/or quality of a received signal may be degraded or deteriorated. To address this problem or improve signal integrity (SI), the equalization (or equalizing) technique has been used to restore or recover the received signal by canceling or compensating the interference signals. One of various equalization techniques is the decision feedback equalization. In the decision feedback equalization, the signal integrity may be improved by canceling the interference signals (e.g., by canceling post-cursors that cause the intersymbol interference), however, there may be a feedback delay because current data is compensated after determining the amount of signal compensation depending on a result of deciding previous data. To reduce the feedback delay, the decision feedback equalization with the loop-unrolling structure has been researched. In the loop-unrolling structure, output candidates may be generated by pre-calculating compensation signals based on all possible results of decision values, and then one of the output candidates may be selected as a final output value.

The receiver 1000 according to example embodiments may receive the multi-level signal, and may be implemented with the loop-unrolling structure. For example, the receiver 1000 may be implemented as a dual mode loop-unrolling DFE that operates in one of the first and second operation modes based on the operating environment. In the second operation mode, only a part (or portion) of the compensation circuit 1100 and the sampling circuit 1200 included in the receiver 1000 may be enabled. Accordingly, the timing margin issue may be improved or enhanced using the loop-unrolling structure, and the power consumption may be reduced by selecting the operation mode based on the operating environment.

Figure 2A:
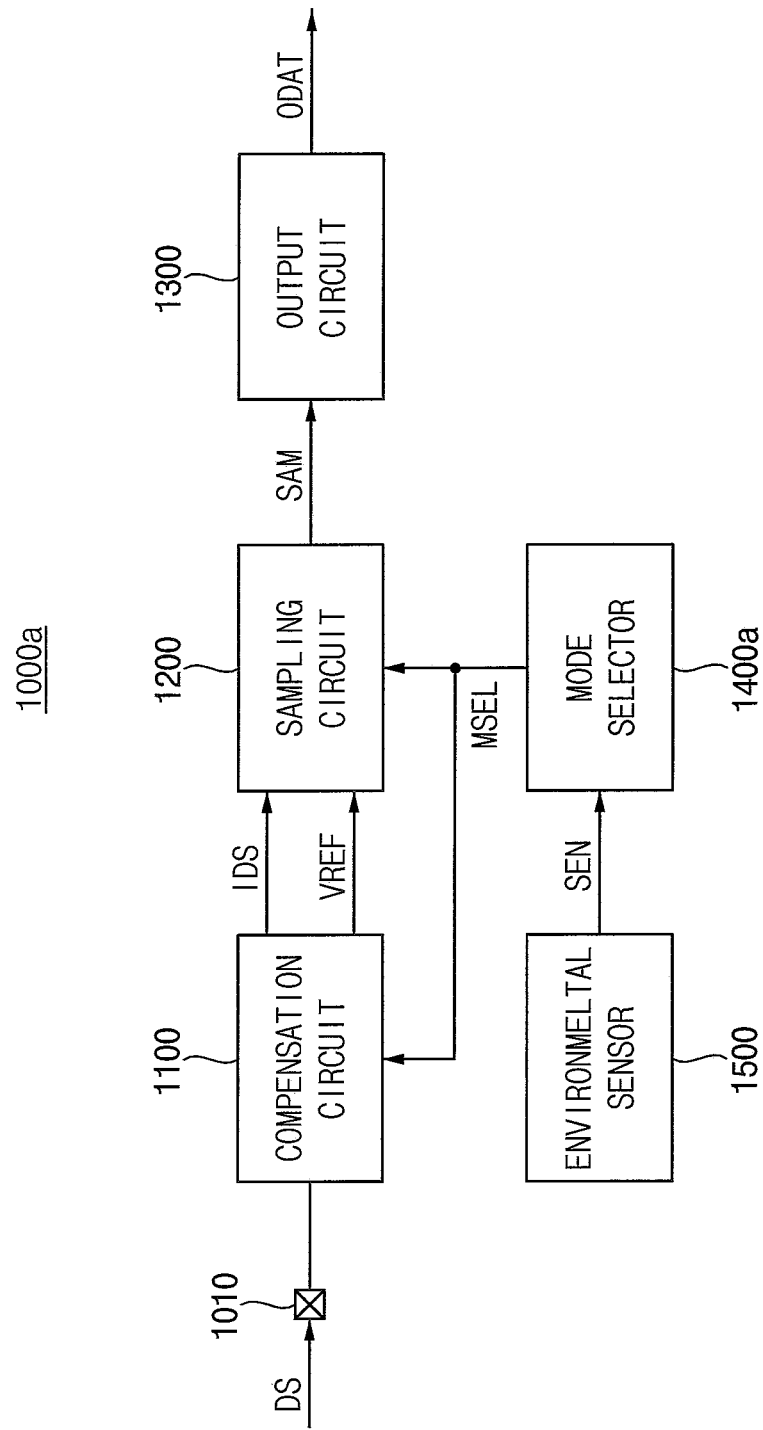
FIGS. 2A and 2B are block diagrams illustrating examples of a receiver, according to some embodiments.
Figure 2B:
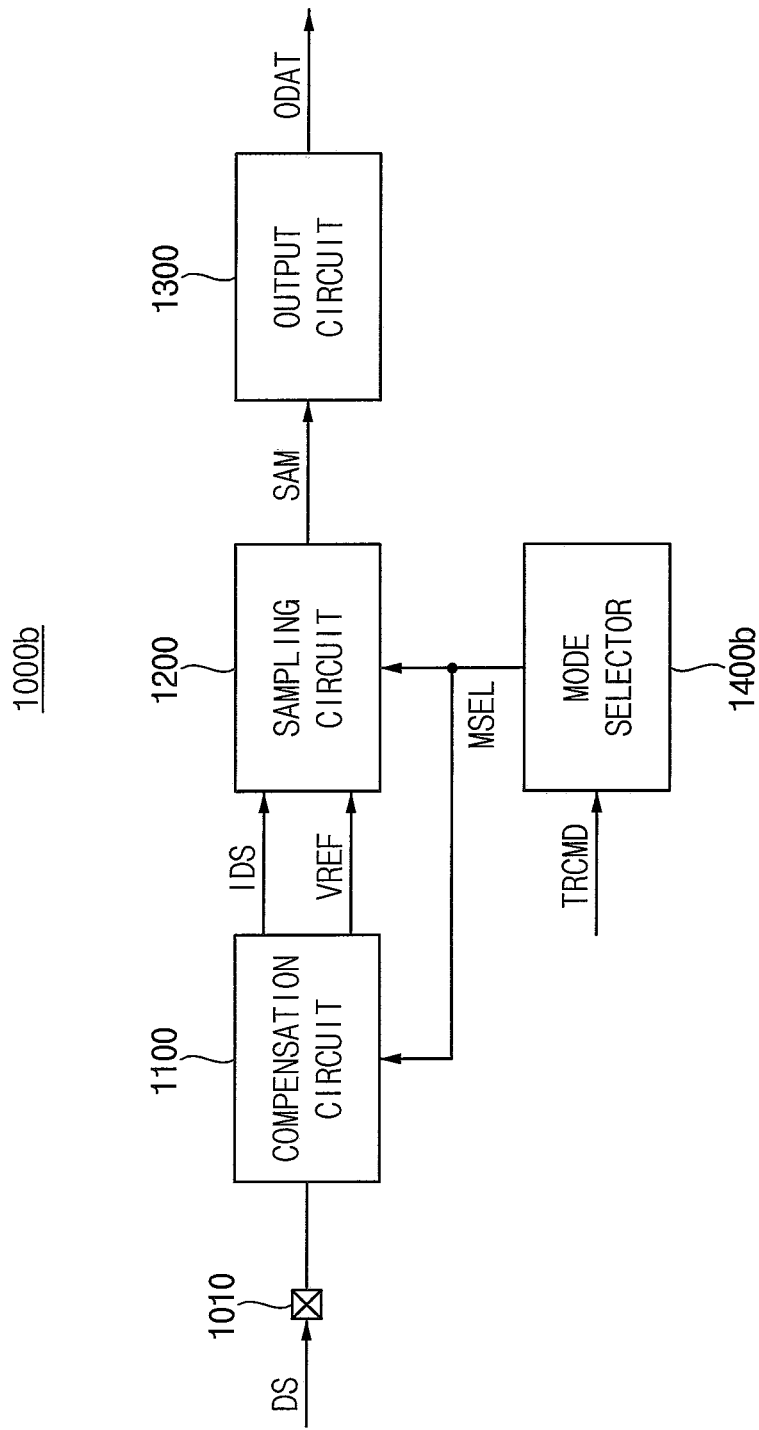

FIGS. 2A and 2B are block diagrams illustrating examples of a receiver, according to certain embodiments. The descriptions repeated with FIG. 1 will be omitted.

Referring to FIG. 2A, a receiver 1000a includes a compensation circuit 1100, a sampling circuit 1200, an output circuit 1300 and a mode selector 1400a. The receiver 1000a may further include a data input pad 1010 and an environmental sensor 1500.

The receiver 1000a may be substantially the same as the receiver 1000 of FIG. 1, except that the receiver 1000a further includes the environmental sensor 1500 and an operation of the mode selector 1400a is partially changed.

The environmental sensor 1500, also described as an environmental sensor circuit, may generate a sensing signal SEN by detecting a change in an operating environment (or a surrounding environment) of the receiver 1000a, e.g., by detecting a change in an operating environment of a memory device and/or a memory system including the receiver 1000a. For example, the environmental sensor 1500 may activate the sensing signal SEN when the operating environment changes to out of a predetermined reference range.

In some example embodiments, the environmental sensor 1500 may include at least one of a temperature sensor, a humidity sensor, a pressure sensor, a motion sensor, a temporal sensor, a spatial sensor, an illumination sensor, an acceleration sensor, a vibration sensor, a mechanical stress sensor, a shock sensor, a frequency sensor, a voltage sensor and a channel environment sensor. In other words, the operating environment may include at least one of temperature, humidity, pressure, motion, time, space, illuminance, acceleration, vibration, mechanical stress, shock, an operating frequency of the memory device (or the memory system), an operating voltage of the memory device (or the memory system), and a channel environment or characteristic of the memory device (or the memory system). However, example embodiments are not limited thereto, and the environmental sensor 1500 may further include at least one sensor that collects at least one of various environment information, such as an external force sensor, a radiation sensor, a dust sensor, an electrical stress sensor, or the like.

The mode selector 1400a may generate the mode selection signal MSEL based on an output of the environmental sensor 1500, (e.g., based on the sensing signal SEN), and may set and/or change the operation mode. For example, based on a particular characteristic or set of characteristics (e.g., temperature being over or under a threshold; humidity being over or under a threshold, operating voltage being over or under a threshold, or a combination thereof), a mode may be selected by setting the mode selection signal MSEL to have a particular value reflecting a selected mode.

Referring to FIG. 2B, a receiver 1000b includes a compensation circuit 1100, a sampling circuit 1200, an output circuit 1300 and a mode selector 1400b. The receiver 1000b may further include a data input pad 1010.

The receiver 1000b may be substantially the same as the receiver 1000 of FIG. 1, except that an operation of the mode selector 1400b is partially changed.

In an initial operation time (or when the receiver 1000b is powered on), or while the receiver 1000b is operating, the receiver 1000b may enter a training mode in which a training operation is performed based on an external command (e.g., based on a training command TRCMD). The mode selector 1400b may generate the mode selection signal MSEL based on a result of the training operation. Then, after the training is complete, the mode selector 1400b may operate the same way as the mode selector 1400 of FIG. 1.

Although FIG. 2B illustrates that the training command TRCMD is directly provided to the receiver 1000b, example embodiments are not limited thereto. For example, the training command TRCMD may be decoded by a command decoder and the decoded command may be provided to the receiver 1000b.

Figure 3:
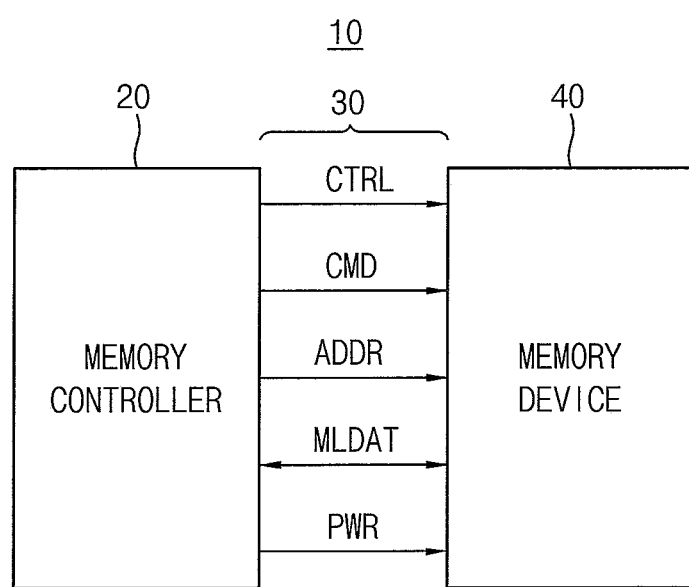
FIG. 3 is a block diagram illustrating a memory system according to example embodiments.

FIG. 3 is a block diagram illustrating a memory system according to example embodiments.

Referring to FIG. 3, a memory system 10 includes a memory controller 20 and a memory device 40. The memory system 10 may further include a plurality of signal lines 30 that electrically connect the memory controller 20 with the memory device 40.

The memory device 40 is controlled by the memory controller 20. For example, based on requests from a host (not illustrated), the memory controller 20 may store (e.g., write or program) data into the memory device 40, or may retrieve (e.g., read or sense) data from the memory device 40.

The plurality of signal lines 30 may include control lines, command lines, address lines, data input/output (I/O) lines and power lines. The memory controller 20 may transmit a command CMD, an address ADDR and a control signal CTRL to the memory device 40 via the command lines, the address lines and the control lines, may exchange a data signal MLDAT with the memory device 40 via the data I/O lines, and may transmit a power supply voltage PWR to the memory device 40 via the power lines. For example, the data signal MLDAT may be the multi-level signal that is received according to example embodiments. Although not illustrated in FIG. 3, the plurality of signal lines 30 may further include data strobe signal (DQS) lines for transmitting a DQS signal.

In some example embodiments, at least a part or all of the signal lines 30 may be referred to as a channel. The term "channel" as used herein may represent signal lines that include the data I/O lines for transmitting the data signal MLDAT. However, example embodiments are not limited thereto, and the channel may further include the command lines for transmitting the command CMD and/or the address lines for transmitting the address ADDR.

Figure 4B:
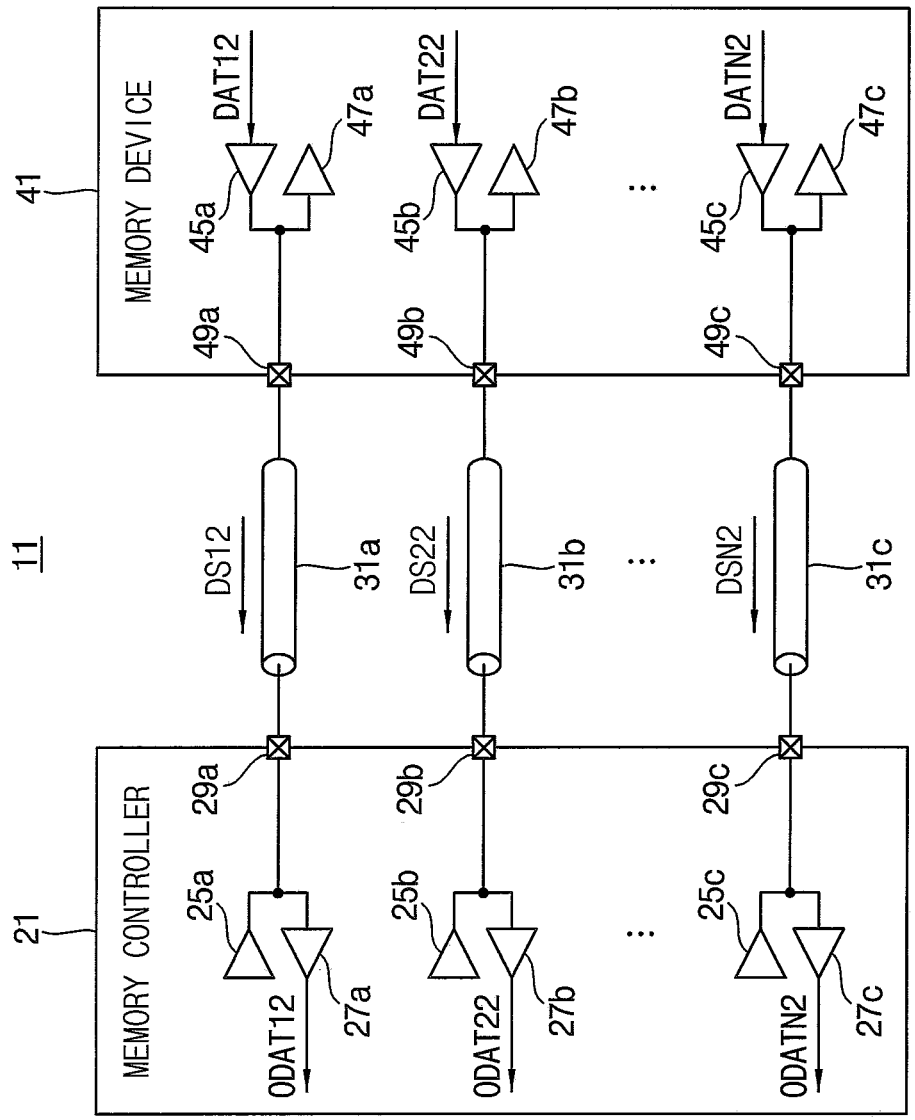

FIGS. 4A and 4B are block diagrams illustrating an example of a memory system of FIG. 3, according to some embodiments.

Referring to FIGS. 4A and 4B, a memory system 11 includes a memory controller 21, a memory device 41 and a plurality of channels 31a, 31b and 31c. For example, the number of the channels 31a, 31b and 31c may be N, where N is a natural number greater than or equal to two.

The memory controller 21 may include a plurality of transmitters 25a, 25b and 25c, a plurality of receivers 27a, 27b and 27c, and a plurality of data I/O pads 29a, 29b and 29c. The memory device 41 may include a plurality of transmitters 45a, 45b and 45c, a plurality of receivers 47a, 47b and 47c, and a plurality of data I/O pads 49a, 49b and 49c. The plurality of data I/O pads 29a, 29b, and 29c, and 49a, 49b, and 49c may be pads, pins, or other types of conductive terminals.

Each of the plurality of transmitters 25a, 25b, 25c, 45a, 45b and 45c may be a circuit configured to generate a multi-level signal. Each of the plurality of receivers 27a, 27b, 27c, 47a, 47b and 47c may receive the multi-level signal, and may be the receiver according to example embodiments. For example, each of the plurality of receivers 27a, 27b, 27c, 47a, 47b and 47c may be the receiver which is described with reference to FIG. 1, and may be implemented according to the examples which will be described with reference to FIGS. 8 through 18.

Each of the plurality of data I/O pads 29a, 29b, 29c, 49a, 49b and 49c may be connected to a respective one of the plurality of transmitters 25a, 25b, 25c, 45a, 45b and 45c and a respective one of the plurality of receivers 27a, 27b, 27c, 47a, 47b and 47c.

The plurality of channels 31a, 31b and 31c may connect the memory controller 21 to the memory device 41. Each of the plurality of channels 31a, 31b and 31c may be connected to a respective one of the plurality of transmitters 25a, 25b and 25c and a respective one of the plurality of receivers 27a, 27b and 27c through a respective one of the plurality of data I/O pads 29a, 29b and 29c. In addition, each of the plurality of channels 31a, 31b and 31c may be connected to a respective one of the plurality of transmitters 45a, 45b and 45c and a respective one of the plurality of receivers 47a, 47b and 47c through a respective one of the plurality of data I/O pads 49a, 49b and 49c. The multi-level signal may be transmitted through each of the plurality of channels 31a, 31b and 31c.

FIG. 4A illustrates an operation of transferring data from the memory controller 21 to the memory device 41. For example, the transmitter 25a may generate a data signal DS11, which is the multi-level signal, based on input data DAT11, the data signal DS11 may be transmitted from the memory controller 21 to the memory device 41 through the channel 31a, and the receiver 47a may receive the data signal DS11 to obtain output data ODAT11 corresponding to the input data DAT11. Similarly, the transmitter 25b may generate a data signal DS21, which is the multi-level signal, based on input data DAT21, the data signal DS21 may be transmitted to the memory device 41 through the channel 31b, and the receiver 47b may receive the data signal DS21 to obtain output data ODAT21 corresponding to the input data DAT21. The transmitter 25c may generate a data signal DSN1, which is the multi-level signal, based on input data DATN1, the data signal DSN1 may be transmitted to the memory device 41 through the channel 31c, and the receiver 47c may receive the data signal DSN1 to obtain output data ODATN1 corresponding to the input data DATN1. For example, the input data DAT11, DAT21 and DATN1 may be write data to be written into the memory device 41, and a write command and a write address may be provided to the memory device 41 together with the write data.

FIG. 4B illustrates an operation of transferring data from the memory device 41 to the memory controller 21. For example, the transmitter 45a may generate a data signal DS12, which is the multi-level signal, based on input data DAT12, the data signal DS12 may be transmitted from the memory device 41 to the memory controller 21 through the channel 31a, and the receiver 27a may receive the data signal DS12 to obtain output data ODAT12 corresponding to the input data DAT12. Similarly, the transmitter 45b may generate a data signal DS22, which is the multi-level signal, based on input data DAT22, the data signal DS22 may be transmitted to the memory controller 21 through the channel 31b, and the receiver 27b may receive the data signal DS22 to obtain output data ODAT22 corresponding to the input data DAT22. The transmitter 45c may generate a data signal DSN2, which is the multi-level signal, based on input data DATN2, the data signal DSN2 may be transmitted to the memory controller 21 through the channel 31c, and the receiver 27c may receive the data signal DSN2 to obtain output data ODATN2 corresponding to the input data DATN2. For example, the input data DAT12, DAT22 and DATN2 may be read data retrieved from the memory device 41, and a read command and a read address for retrieving the read data may be provided to the memory device 41.

Figure 5:
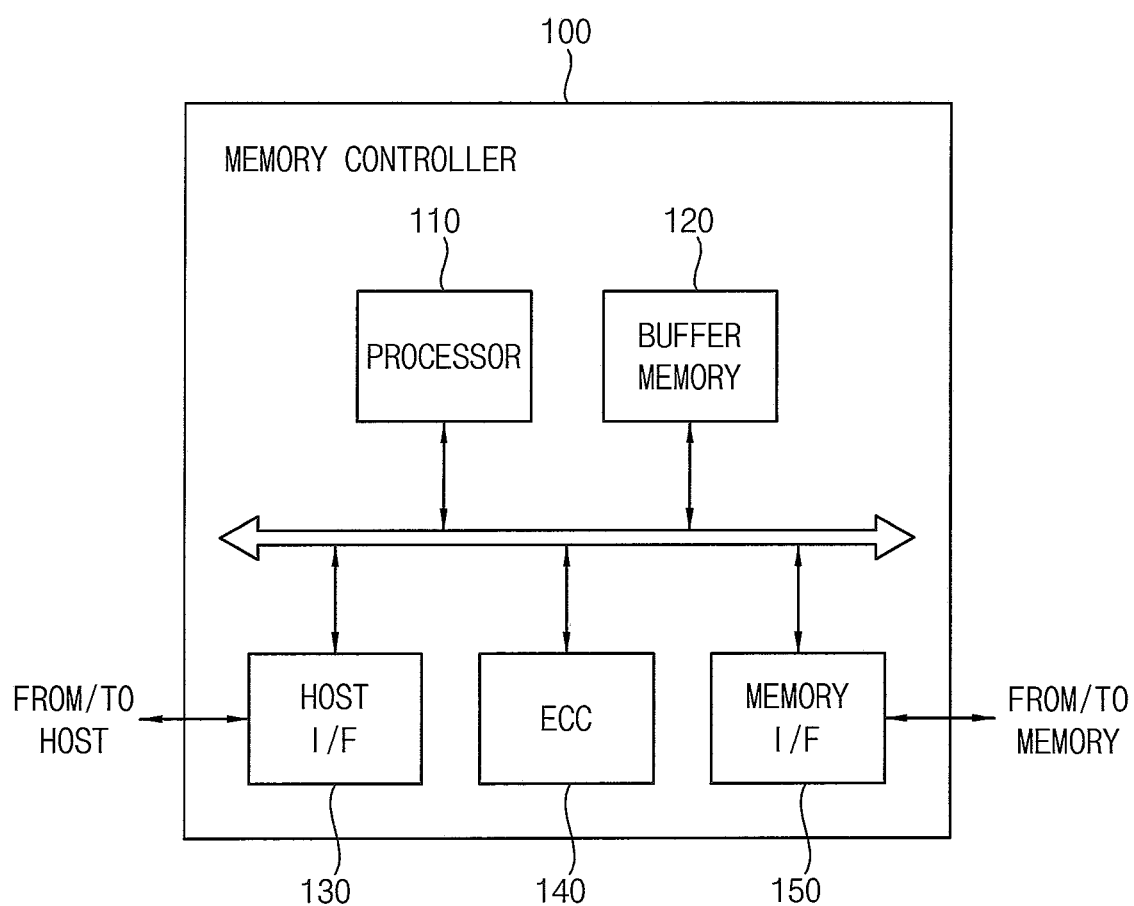
FIG. 5 is a block diagram illustrating an example of a memory controller included in a memory system according to example embodiments.

FIG. 5 is a block diagram illustrating an example of a memory controller included in a memory system according to example embodiments.

Referring to FIG. 5, a memory controller 100 may include at least one processor 110, a buffer memory 120, a host interface 130, an error correction code (ECC) block 140 and a memory interface 150.

The processor 110 may control an operation of the memory controller 100 in response to a command and/or request received via the host interface 130 from an external host (not illustrated). For example, the processor 110 may control respective components by employing firmware for operating a memory device (e.g., the memory device 40 in FIG. 3).

The buffer memory 120 may store instructions and data executed and processed by the processor 110. For example, the buffer memory 120 may be implemented with a volatile memory device such as a dynamic random access memory (DRAM), a static random access memory (SRAM), a cache memory, or the like.

The host interface 130 may provide physical connections between the host and the memory controller 100. The host interface 130 may provide an interface corresponding to a bus format of the host for communication between the host and the memory controller 100. In some example embodiments, the bus format of the host may be a small computer system interface (SCSI) or a serial attached SCSI (SAS) interface. In other example embodiments, the bus format of the host may be a USB, a peripheral component interconnect (PCI) express (PCIe), an advanced technology attachment (ATA), a parallel ATA (PATA), a serial ATA (SATA), a nonvolatile memory (NVM) express (NVMe), etc., format.

The ECC block 140 for error correction may perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using above-described codes or other error correction codes.

The memory interface 150 may exchange data with the memory device. The memory interface 150 may transmit a command and an address to the memory device, and may transmit data to the memory device or receive data read from the memory device. Although not illustrated in FIG. 5, a transmitter, or plurality of transmitters (e.g., the transmitter(s) 25a in FIG. 4A) that generates the multi-level signal and a receiver, or plurality of receivers (e.g., the receiver(s) 27a in FIG. 4A) that receives the multi-level signal according to example embodiments may be included in the memory interface 150.

Figure 6A:
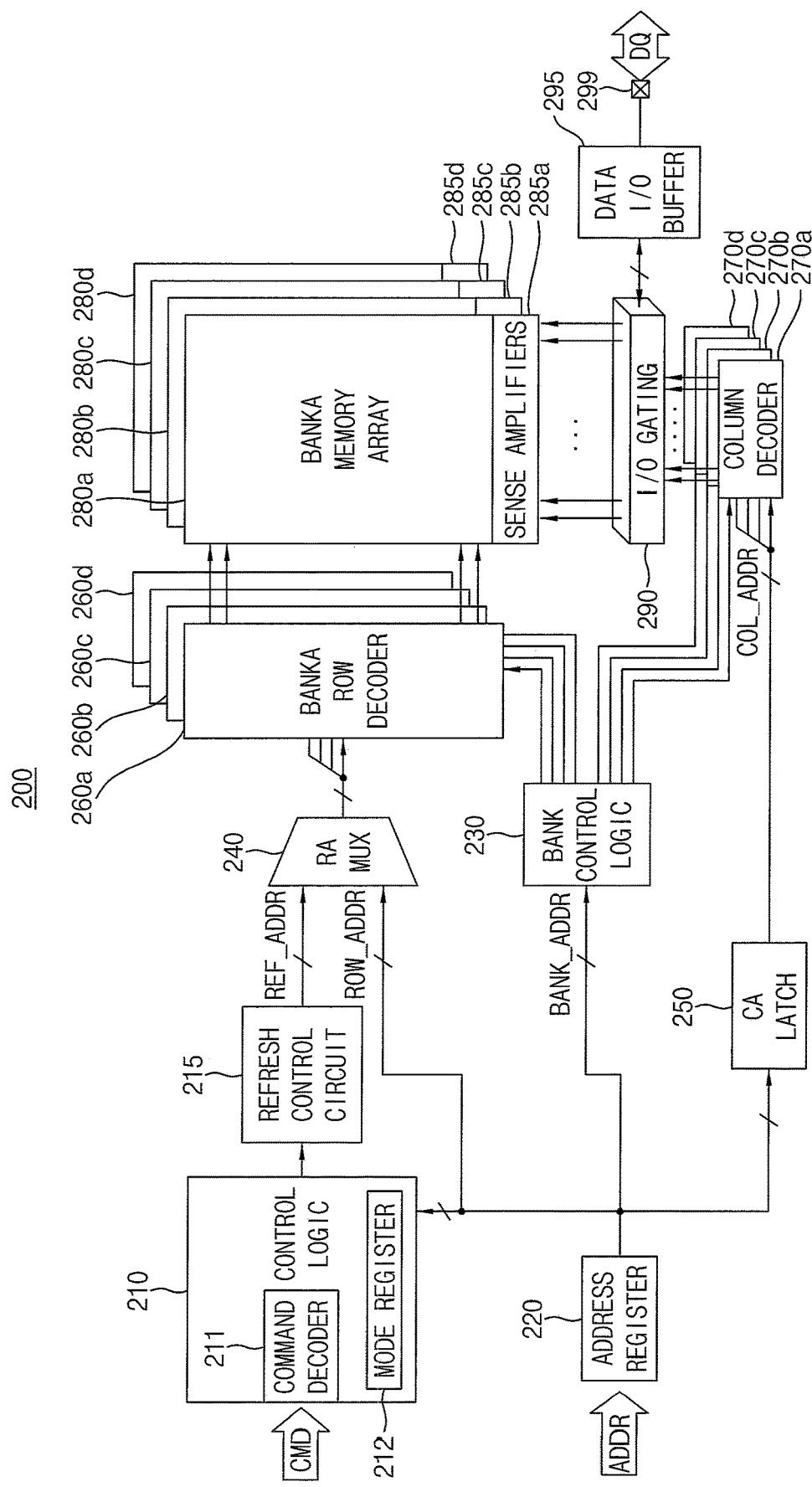
FIGS. 6A and 6B are block diagrams illustrating examples of a memory device included in a memory system according to example embodiments.
Figure 6B:
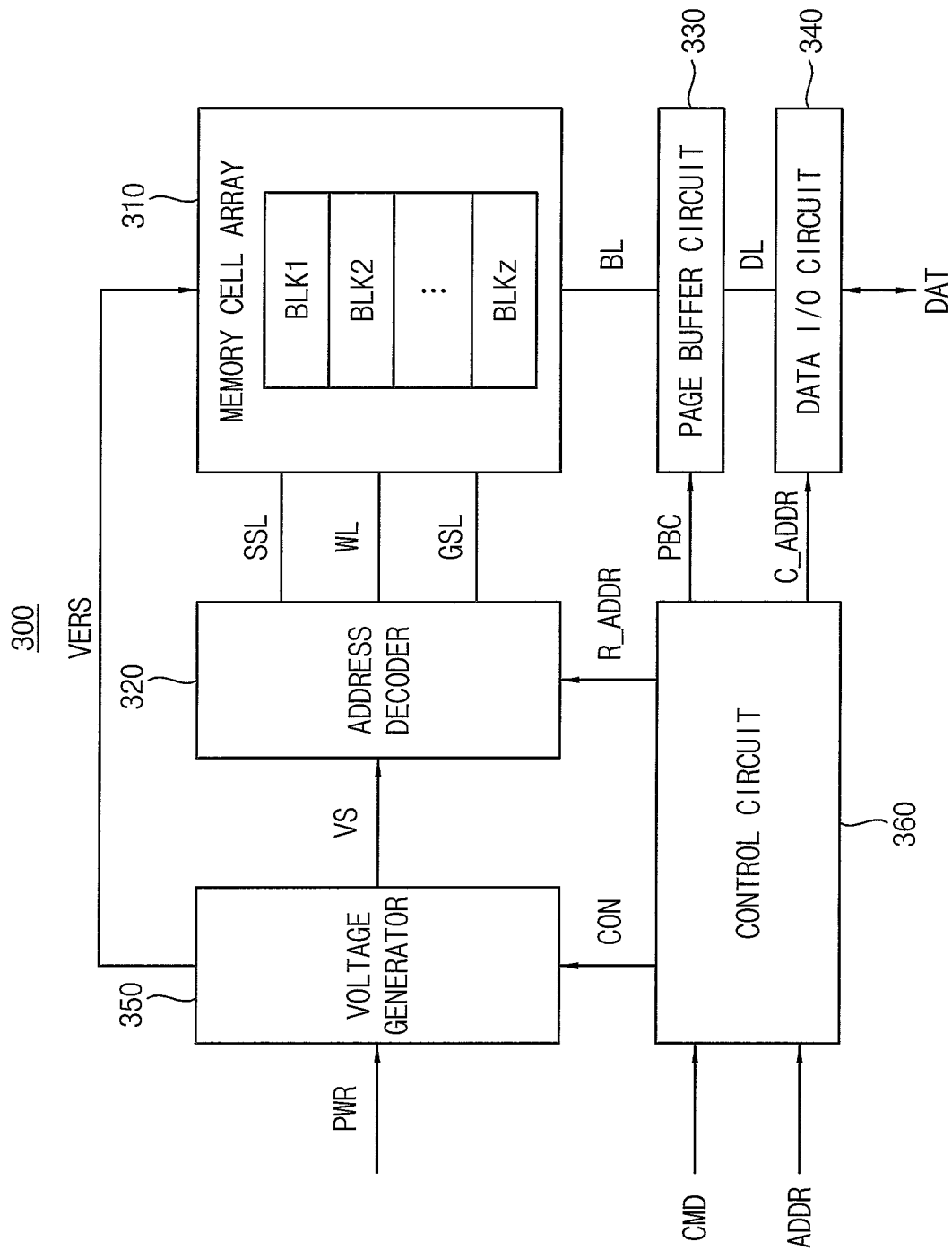

FIGS. 6A and 6B are block diagrams illustrating examples of a memory device included in a memory system according to example embodiments.

Referring to FIG. 6A, a memory device 200 includes a control logic 210, a refresh control circuit 215, an address register 220, a bank control logic 230, a row address multiplexer 240, a column address latch 250, a row decoder, a column decoder, a memory cell array, a sense amplifier unit, an input/output (I/O) gating circuit 290, a data I/O buffer 295 and a data I/O pad 299. In some example embodiments, the memory device 200 may be, e.g., a volatile memory device. For example, the memory device 200 may be one of various volatile memory devices such as a dynamic random access memory (DRAM).

The memory cell array may include a plurality of memory cells. The memory cell array may include a plurality of bank arrays, e.g., first through fourth bank arrays 280a, 280b, 280c and 280d. The row decoder may include a plurality of bank row decoders, e.g., first through fourth bank row decoders 260a, 260b, 260c and 260d connected to the first through fourth bank arrays 280a, 280b, 280c and 280d, respectively. The column decoder may include a plurality of bank column decoders, e.g., first through fourth bank column decoders 270a, 270b, 270c and 270d connected to the first through fourth bank arrays 280a, 280b, 280c and 280d, respectively. The sense amplifier unit may include a plurality of bank sense amplifiers, e.g., first through fourth bank sense amplifiers 285a, 285b, 285c and 285d connected to the first through fourth bank arrays 280a, 280b, 280c and 280d, respectively.

The first through fourth bank arrays 280a-280d, the first through fourth bank row decoders 260a-260d, the first through fourth bank column decoders 270a-270d, and the first through fourth bank sense amplifiers 285a-285d may form first through fourth banks, respectively. For example, the first bank array 280a, the first bank row decoder 260a, the first bank column decoder 270a, and the first bank sense amplifier 285a may form the first bank; the second bank array 280b, the second bank row decoder 260b, the second bank column decoder 270b, and the second bank sense amplifier 285b may form the second bank; the third bank array 280c, the third bank row decoder 260c, the third bank column decoder 270c, and the third bank sense amplifier 285c may form the third bank; and the fourth bank array 280d, the fourth bank row decoder 260d, the fourth bank column decoder 270d, and the fourth bank sense amplifier 285d may form the fourth bank.

The address register 220 may receive an address ADDR including a bank address BANK_ADDR, a row address ROW_ADDR and a column address COL_ADDR from a memory controller (e.g., the memory controller 20 in FIG. 3). The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to receipt of the bank address BANK_ADDR. One of the first through fourth bank row decoders 260a-260d corresponding to the received bank address BANK_ADDR may be activated in response to the bank control signals generated by the bank control logic 230, and one of the first through fourth bank column decoders 270a-270d corresponding to the received bank address BANK_ADDR may be activated in response to the bank control signals generated by the bank control logic 230.

The refresh control circuit 215 may generate a refresh address REF_ADDR in response to receipt of a refresh command or entrance of any self refresh mode. For example, the refresh control circuit 215 may include a refresh counter that is configured to sequentially change the refresh address REF_ADDR from a first address of the memory cell array to a last address of the memory cell array. The refresh control circuit 215 may receive control signals from the control logic 210.

The row address multiplexer 240 may receive the row address ROW_ADDR from the address register 220, and may receive the refresh address REF_ADDR from the refresh control circuit 215. The row address multiplexer 240 may selectively output the row address ROW_ADDR or the refresh address REF_ADDR. A row address output from the row address multiplexer 240 (e.g., the row address ROW_ADDR or the refresh address REF_ADDR) may be applied to the first through fourth bank row decoders 260a-260d.

The activated one of the first through fourth bank row decoders 260a-260d may decode the row address output from the row address multiplexer 240, and may activate a wordline corresponding to the row address. For example, the activated bank row decoder may apply a wordline driving voltage to the wordline corresponding to the row address.

The column address latch 250 may receive the column address COL_ADDR from the address register 220, and may temporarily store the received column address COL_ADDR. The column address latch 250 may apply the temporarily stored or received column address COL_ADDR to the first through fourth bank column decoders 270a-270d.

The activated one of the first through fourth bank column decoders 270a-270d may decode the column address COL_ADDR output from the column address latch 250, and may control the I/O gating circuit 290 to output data corresponding to the column address COL_ADDR.

The I/O gating circuit 290 may include a circuitry for gating I/O data. For example, although not shown, the I/O gating circuit 290 may include an input data mask logic, read data latches for storing data output from the first through fourth bank arrays 280a-280d, and write drivers for writing data to the first through fourth bank arrays 280a-280d.

Data DQ to be read from one of the first through fourth bank arrays 280a-280d may be sensed by a sense amplifier coupled to the one bank array, and may be stored in the read data latches. The data DQ stored in the read data latches may be provided to the memory controller via the data I/O buffer 295 and the data I/O pad 299. Data DQ received via the data I/O pad 299 that are to be written to one of the first through fourth bank arrays 280a-280d may be provided from the memory controller to the data I/O buffer 295. The data DQ received via the data I/O pad 299 and provided to the data I/O buffer 295 may be written to the one bank array via the write drivers in the I/O gating circuit 290. Although not illustrated in FIG. 6A, a transmitter, or plurality of transmitters (e.g., the transmitter(s) 45a in FIG. 4A) that generates the multi-level signal and a receiver, or plurality of receivers (e.g., the receiver(s) 47a in FIG. 4A) that receives the multi-level signal according to example embodiments may be included in the data I/O buffer 295.

The control logic 210 may control an operation of the memory device 200. For example, the control logic 210 may generate control signals for the memory device 200 to perform a data write operation or a data read operation. The control logic 210 may include a command decoder 211 that decodes a command CMD received from the memory controller and a mode register 212 that sets an operation mode of the memory device 200.

Referring to FIG. 6B, a memory device 300 may include a memory cell array 310, an address decoder 320, a page buffer circuit 330, a data input/output (I/O) circuit 340, a voltage generator 350 and a control circuit 360. For example, the memory device 300 may be one of various nonvolatile memory devices such as a NAND flash memory device.

The memory cell array 310 is connected to the address decoder 320 via a plurality of string selection lines SSL, a plurality of wordlines WL and a plurality of ground selection lines GSL. The memory cell array 310 is further connected to the page buffer circuit 330 via a plurality of bitlines BL. The memory cell array 310 may include a plurality of memory cells (e.g., a plurality of nonvolatile memory cells) that are connected to the plurality of wordlines WL and the plurality of bitlines BL. The memory cell array 310 may be divided into a plurality of memory blocks BLK1, BLK2, . . . , BLKz each of which includes memory cells.

In some example embodiments, the plurality of memory cells may be arranged in a two dimensional (2D) array structure or a three dimensional (3D) vertical array structure. A three-dimensional vertical array structure may include vertical cell strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

The control circuit 360 receives a command CMD and an address ADDR from the outside (e.g., from the memory controller 20 in FIG. 3), and control erasure, programming and read operations of the memory device 300 based on the command CMD and the address ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recovery read operation.

For example, the control circuit 360 may generate control signals CON, which are used for controlling the voltage generator 350, and may generate control signal PBC for controlling the page buffer circuit 330, based on the command CMD, and may generate a row address R_ADDR and a column address C_ADDR based on the address ADDR. The control circuit 360 may provide the row address R_ADDR to the address decoder 320 and may provide the column address C_ADDR to the data I/O circuit 340.

The address decoder 320 may be connected to the memory cell array 310 via the plurality of string selection lines SSL, the plurality of wordlines WL and the plurality of ground selection lines GSL. For example, in the data erase/write/read operations, the address decoder 320 may determine at least one of the plurality of wordlines WL as a selected wordline, at least one of the plurality of string selection lines SSL as a selected string selection line, and at least one of the plurality of ground selection lines GSL as a selected ground selection line, based on the row address R_ADDR.

The voltage generator 350 may generate voltages VS that are used or required for an operation of the memory device 300 based on a power PWR and the control signals CON. The voltages VS may be applied to the plurality of string selection lines SSL, the plurality of wordlines WL and the plurality of ground selection lines GSL via the address decoder 320. In addition, the voltage generator 350 may generate an erase voltage VERS that is required for the data erase operation based on the power PWR and the control signals CON.

The page buffer circuit 330 may be connected to the memory cell array 310 via the plurality of bitlines BL. The page buffer circuit 330 may include a plurality of page buffers. The page buffer circuit 330 may store data DAT to be programmed into the memory cell array 310 or may read data DAT sensed from the memory cell array 310. For example, the page buffer circuit 330 may operate as a write driver or a sensing amplifier according to an operation mode of the memory device 300.

The data I/O circuit 340 may be connected to the page buffer circuit 330 via data lines DL. The data I/O circuit 340 may provide the data DAT from the outside of the memory device 300 to the memory cell array 310 via the page buffer circuit 330 or may provide the data DAT from the memory cell array 310 to the outside of the memory device 300, based on the column address C_ADDR. Although not illustrated in FIG. 6B, a transmitter, or plurality of transmitters (e.g., the transmitter(s) 45a in FIG. 4A) that generates the multi-level signal and a receiver, or plurality of receivers (e.g., the receiver(s) 47a in FIG. 4A) that receives the multi-level signal according to example embodiments may be included in the data I/O circuit 340.

Although the memory device included in the memory system according to example embodiments is described based on a DRAM and a NAND flash memory, the memory device according to example embodiments may be any volatile memory device, and/or any nonvolatile memory device, e.g., a static random access memory (SRAM), a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), or the like.

Figure 7A:
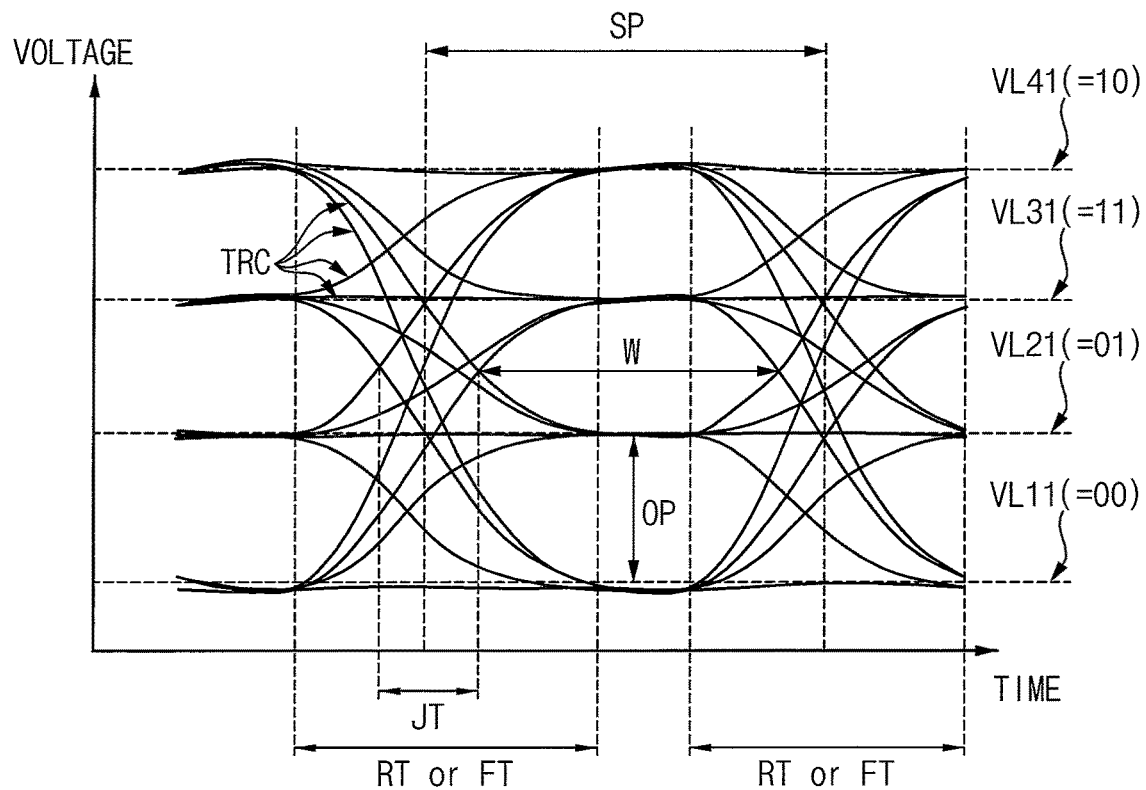
FIGS. 7A, 7B and 7C are diagrams for describing a data signal that is generated based on multi-level signaling scheme according to example embodiments.
Figure 7B:
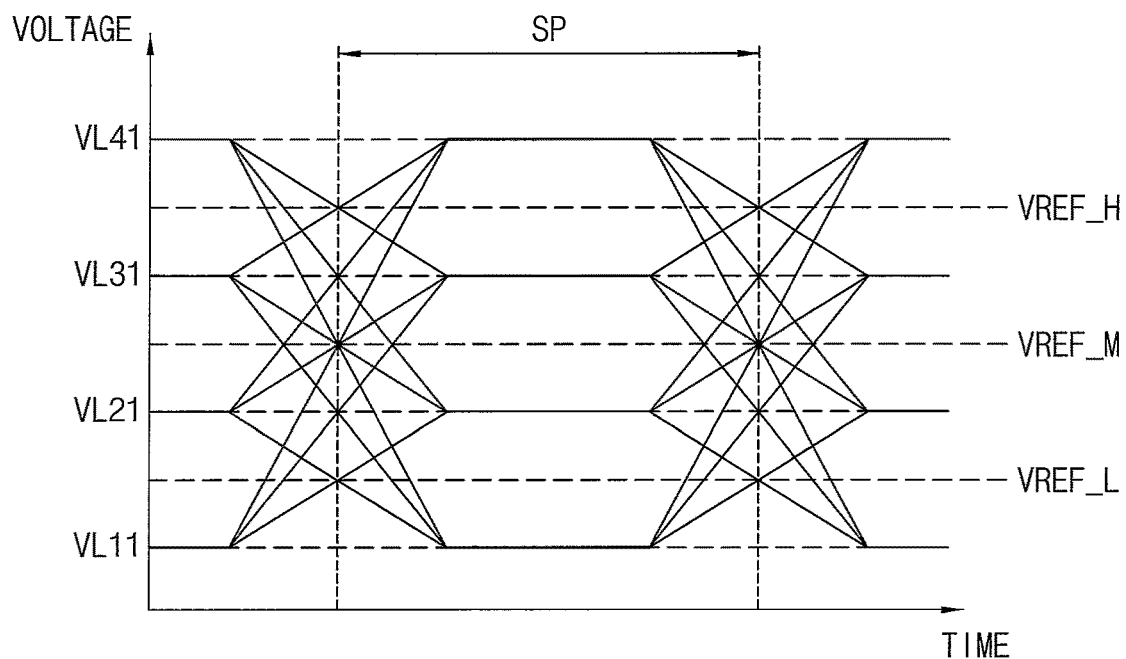
Figure 7C:
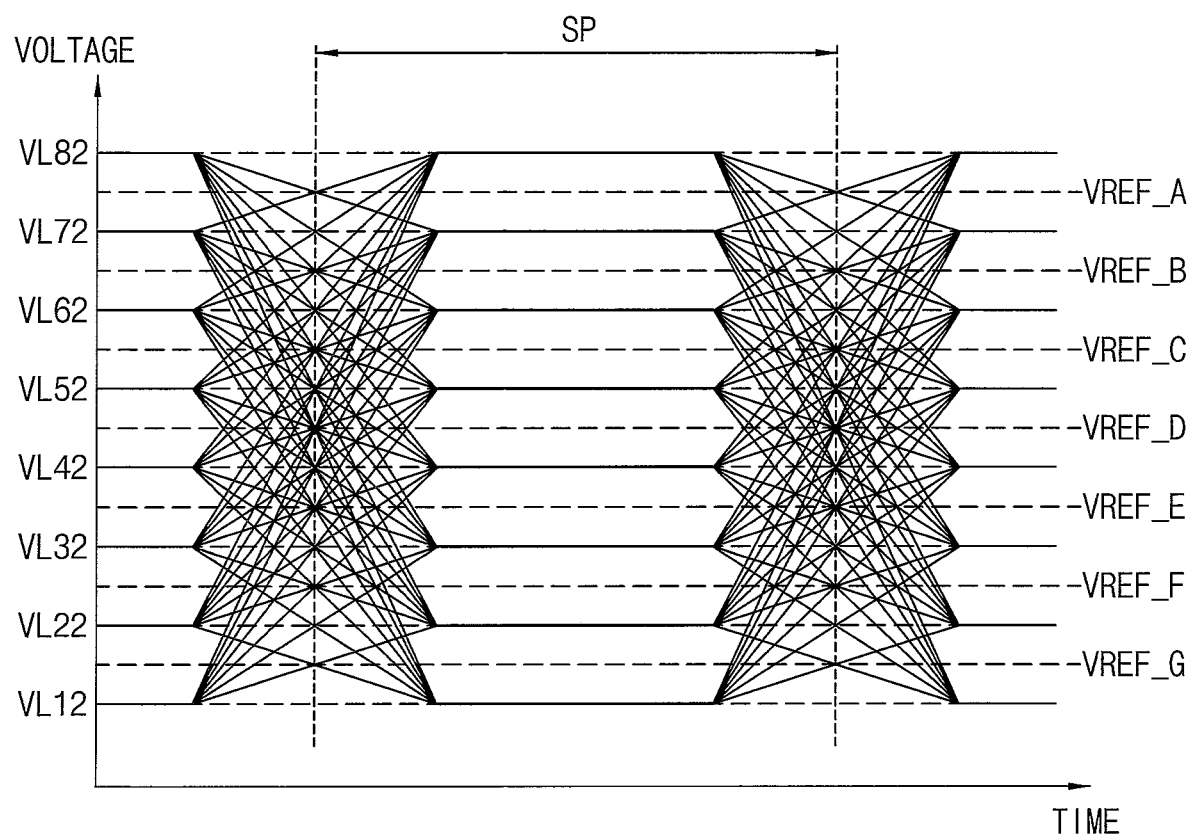

FIGS. 7A, 7B and 7C are diagrams for describing a data signal that is generated based on a multi-level signaling scheme according to example embodiments.

FIG. 7A illustrates an ideal eye diagram of a data signal (e.g., a PAM4 signal) generated based on the 4-level scheme (e.g., the PAM4 scheme) that is an example of the multi-level signaling scheme (e.g., the PAM scheme). FIG. 7B is a diagram illustrated by simplifying the ideal eye diagram of FIG. 7A. FIG. 7C is a diagram illustrated by simplifying an ideal eye diagram of a data signal (e.g., a PAM8 signal) generated based on the 8-level scheme (e.g., the PAM8 scheme).

Referring to FIG. 7A, an eye diagram may be used to indicate the quality of signals in high-speed transmissions. For example, the eye diagram may represent four symbols of a signal (e.g., '00,' '01,' '10' and '11'), and each of the four symbols may be represented by a respective one of different voltage levels (e.g., voltage amplitudes) VL11, VL21, VL31 and VL41. The eye diagram may be used to provide a visual indication of the health of the signal integrity, and may indicate noise margins of the data signal. For example, when a Gray code is used, the voltage levels VL11, VL21, VL31 and VL41 may be mapped to '00', '01', '11', and '10', respectively.

To generate the eye diagram, an oscilloscope or other computing device may sample a digital signal according to a sample period SP (e.g., a unit interval or a bit period). The sample period SP may be defined by a clock associated with the transmission of the measured signal. The oscilloscope or other computing device may measure the voltage level of the signal during the sample period SP to form the plurality of traces TRC. Various characteristics associated with the measured signal may be determined by overlaying the plurality of traces TRC.

The eye diagram may be used to identify a number of characteristics of a communication signal such as jitter, cross talk, electromagnetic interference (EMI), signal loss, signal-to-noise ratio (SNR), other characteristics, or combinations thereof. For example, a width W of an eye in the eye diagram may be used to indicate a timing synchronization of the measured signal or jitter effects of the measured signal. For example, the eye diagram may indicate an eye opening OP, which represents a peak-to-peak voltage difference between the various voltage levels VL11, VL21, VL31 and VL41. The eye opening OP may be related to a voltage margin for discriminating between different voltage levels VL11, VL21, VL31 and VL41 of the measured signal. For example, the eye diagram may be used to identify a rise time RT and/or a fall time FT for transitions from a first amplitude to a second amplitude. The rise time RT or the fall time FT may indicate a time required for transitioning from one voltage level to another voltage level, may be related to or associated with a rising edge and a falling edge, respectively. For example, the eye diagram may be used to identify an amount of jitter JT in the measured signal. The jitter JT may refer to a timing error that results from a misalignment of rise and fall times. The jitter JT may occur when the rising edge or the falling edge occurs at a time that is different from an ideal time defined by the data clock. The jitter JT may be caused by signal reflections, intersymbol interference, crosstalk, process-voltage-temperature (PVT) variations, random jitter, additive noise, or combinations thereof.

Referring to FIG. 7B, different first, second, third and fourth voltage levels VL11, VL21, VL31 and VL41 of the data signal that is the PAM4 signal are illustrated, and different first, second and third reference levels VREF_H, VREF_M and VREF_L for sensing or detecting the level of the data signal are illustrated. For example, the number of the reference levels may be less than the number of the voltage levels of the data signal by one.

The first voltage level VL11 that is the lowest voltage level among the voltage levels VL11-VL41 may be lower than the second voltage level VL21, the second voltage level VL21 may be lower than the third voltage level VL31, and the third voltage level VL31 may be lower than the fourth voltage level VL41 that is the highest voltage level among the voltage levels VL11-VL41. In addition, the first reference level VREF_H may be a level between the third and fourth voltage levels VL31 and VL41, the second reference level VREF_M may be a level between the second and third voltage levels VL21 and VL31, and the third reference level VREF_L may be a level between the first and second voltage levels VL11 and VL21. The voltage level (e.g., the symbol) of the data signal may be decided or determined based on a result of comparing the data signal with the reference levels VREF_H, VREF_M and VREF_L. Thus, the determined voltage level may actually be a level between two reference levels.

Referring to FIG. 7C, different first, second, third, fourth, fifth, sixth, seventh and eighth voltage levels VL12, VL22, VL32, VL42, VL52, VL62, VL72 and VL82 of the data signal that is the PAM8 signal are illustrated, and different first, second, third, fourth, fifth, sixth and seventh reference levels VREF_A, VREF_B, VREF_C, VREF_D, VREF_E, VREF_F and VREF_G for sensing or detecting the level of the data signal are illustrated.

Hereinafter, example embodiments will be described in detail based on the PAM4 scheme. However, example embodiments are not limited thereto, and example embodiments may be applied or employed to the PAM(K) scheme having K possible pulse amplitudes.

Figure 8:
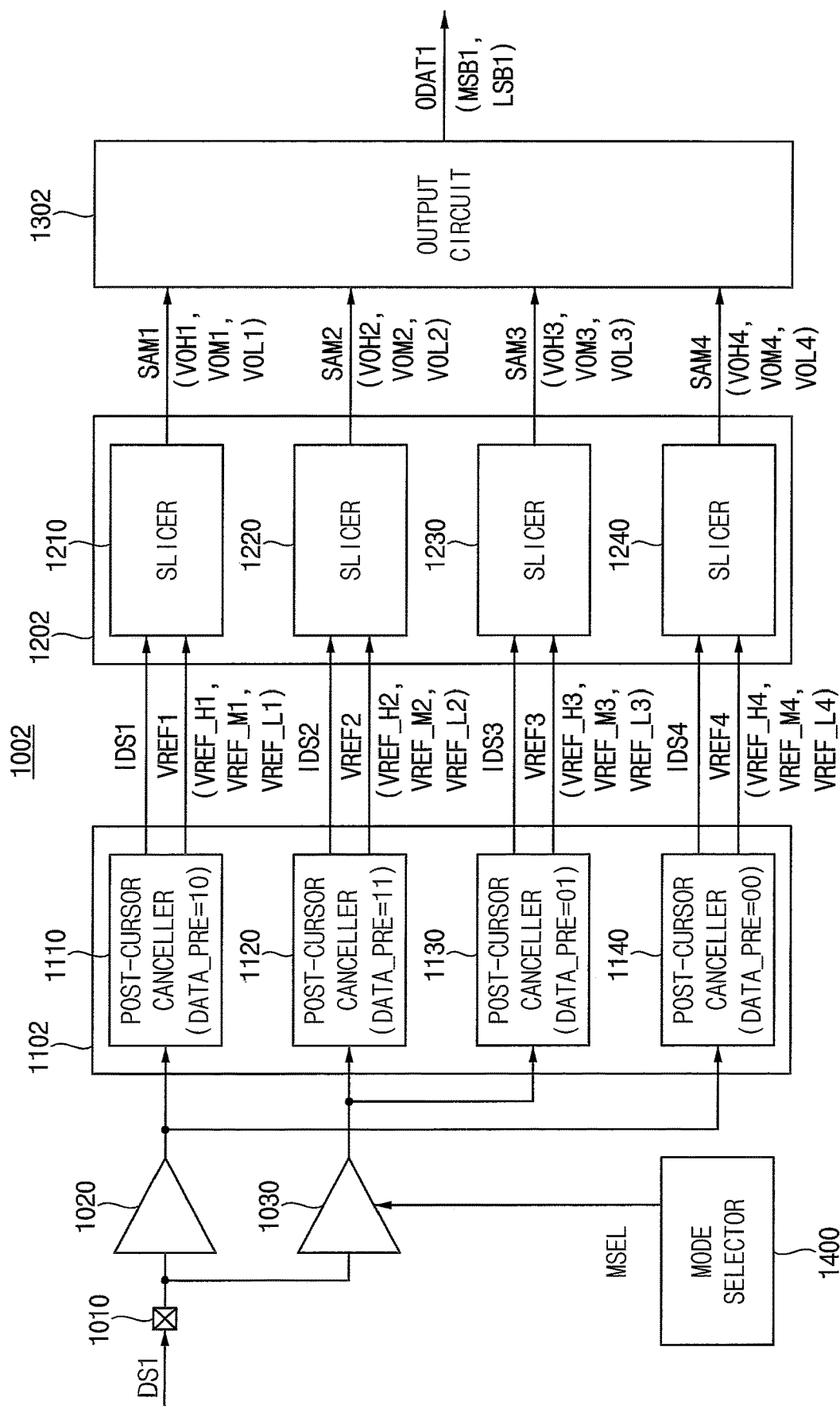
FIG. 8 is a block diagram illustrating an example of a receiver of FIG. 1, according to some embodiments.

FIG. 8 is a block diagram illustrating an example of a receiver such as a receiver in the embodiment of FIG. 1.

Referring to FIG. 8, a receiver 1002 includes a compensation circuit 1102, a sampling circuit 1202, an output circuit 1302 and a mode selector 1400. The receiver 1002 may further include a data input pad 1010, a first buffer 1020 and a second buffer 1030.

The data input pad 1010 may receive an input data signal DS1 having one of the first, second, third and fourth voltage levels VL11, VL21, VL31 and VL41 during one UI.

The compensation circuit 1102 may include a first post-cursor canceller 1110, a second post-cursor canceller 1120, a third post-cursor canceller 1130 and a fourth post-cursor canceller 1140.

The first post-cursor canceller 1110 may generate a first data signal IDS1 and a first reference voltage VREF1 based on when a previous value DATA_PRE of output data ODAT1 is '10' (e.g., corresponds to the fourth voltage level VL41). The second post-cursor canceller 1120 may generate a second data signal IDS2 and a second reference voltage VREF2 based on when the previous value DATA_PRE of the output data ODAT1 is '11' (e.g., corresponds to the third voltage level VL31). The third post-cursor canceller 1130 may generate a third data signal IDS3 and a third reference voltage VREF3 based on when the previous value DATA_PRE of the output data ODAT1 is '01' (e.g., corresponds to the second voltage level VL21). The fourth post-cursor canceller 1140 may generate a fourth data signal IDS4 and a fourth reference voltage VREF4 based on when the previous value DATA_PRE of the output data ODAT1 is '00' (e.g., corresponds to the first voltage level VL11). For example, each post-cursor canceller may include a feedback filter having an n-tap structure, where n is a natural number.

The first reference voltage VREF1 may include first, second and third compensation reference levels VREF_H1, VREF_M1 and VREF_L1. The second reference voltage VREF2 may include fourth, fifth and sixth compensation reference levels VREF_H2, VREF_M2 and VREF_L2. The third reference voltage VREF3 may include seventh, eighth and ninth compensation reference levels VREF_H3, VREF_M3 and VREF_L3. The fourth reference voltage VREF4 may include tenth, eleventh and twelfth compensation reference levels VREF_H4, VREF_M4, and VREF_L4. Each of the first, fourth, seventh and tenth compensation reference levels VREF_H1, VREF_H2, VREF_H3 and VREF_H4 may correspond to the first reference level VREF_H, and the first, fourth, seventh and tenth compensation reference levels VREF_H1, VREF_H2, VREF_H3 and VREF_H4 may be generated by increasing or decreasing the first reference level VREF_H by a specific level (or amount) based on the equalization. Similarly, each of the second, fifth, eighth and eleventh compensation reference levels VREF_M1, VREF_M2, VREF_M3 and VREF_M4 may correspond to the second reference level VREF_M, and the second, fifth, eighth and eleventh compensation reference levels VREF_M1, VREF_M2, VREF_M3 and VREF_M4 may be generated by increasing or decreasing the second reference level VREF_M by a specific level (or amount) based on the equalization. Each of the third, sixth, ninth and twelfth compensation reference levels VREF_L1, VREF_L2, VREF_L3 and VREF_L4 may correspond to the third reference level VREF_L, and the third, sixth, ninth and twelfth compensation reference levels VREF_L1, VREF_L2, VREF_L3 and VREF_L4 may be generated by increasing or decreasing the third reference level VREF_L by a specific level (or amount) based on the equalization.

In some example embodiments, the data signals IDS1 to IDS4 may be substantially the same as each other. In other example embodiments, the first data signal IDS1 and the first reference voltage VREF1 may be provided as a pair of differential signals, another data signal and a corresponding reference voltage may also be provided as a pair of differential signals, and thus the data signals IDS1 to IDS4 may be different from each other.

The sampling circuit 1202 may include a first slicer 1210, a second slicer 1220, a third slicer 1230 and a fourth slicer 1240. Each slicer may also be described as a slicer circuit.

The first slicer 1210 may generate a first sample signal SAM1 by comparing the first data signal IDS1 with the first, second and third compensation reference levels VREF_H1, VREF_M1 and VREF_L1. The second slicer 1220 may generate a second sample signal SAM2 by comparing the second data signal IDS2 with the fourth, fifth and sixth compensation reference levels VREF_H2, VREF_M2 and VREF_L2. The third slicer 1230 may generate a third sample signal SAM3 by comparing the third data signal IDS3 with the seventh, eighth and ninth compensation reference levels VREF_H3, VREF_M3 and VREF_L3. The fourth slicer 1240 may generate a fourth sample signal SAM4 by comparing the fourth data signal IDS4 with the tenth, eleventh and twelfth compensation reference levels VREF_H4, VREF_M4 and VREF_L4. For example, as will be described with reference to FIG. 9, each slicer may include a plurality of comparators.

The first sample signal SAM1 may include first, second and third decision values VOH1, VOM1 and VOL1. The second sample signal SAM2 may include fourth, fifth and sixth decision values VOH2, VOM2 and VOL2. The third sample signal SAM3 may include seventh, eighth and ninth decision values VOH3, VOM3, and VOL3. The fourth sample signal SAM4 may include tenth, eleventh and twelfth decision values VOH4, VOM4 and VOL4. Each of the first, fourth, seventh and tenth decision values VOH1, VOH2, VOH3 and VOH4 may represent a decision result obtained by comparing the input data signal DS1 with a respective one of the first reference levels equalized by the compensation circuit 1102. Similarly, each of the second, fifth, eighth and eleventh decision values VOM1, VOM2, VOM3 and VOM4 may represent a decision result obtained by comparing the input data signal DS1 with a respective one of the second reference levels equalized by the compensation circuit 1102. Each of the third, sixth, ninth and twelfth decision values VOL1, VOL2, VOL3 and VOL4 may represent a decision result obtained by comparing the input data signal DS1 with a respective one of the third reference levels equalized by the compensation circuit 1102.

The output circuit 1302 may generate the output data ODAT1 including a first bit MSB1 and a second bit LSB1 based on the first through twelfth decision values VOH1~VOH4, VOM1~VOM4 and VOL1~VOL4. The first and second bits MSB1 and LSB1 may be a most significant bit (MSB) and a least significant bit (LSB) of the output data ODAT1, respectively. For example, when the output data ODAT1 is '10', the first bit MSB1 may be '1', and the second bit LSB1 may be '0'.

The first buffer 1020 may buffer the input data signal DS1 and may provide the buffered input data signal to the first and fourth post-cursor cancellers 1110 and 1140. The second buffer 1030 may buffer the input data signal DS1 and may provide the buffered input data signal to the second and third post-cursor cancellers 1120 and 1130. The mode selector 1400 may generate the mode selection signal MSEL used to select one of the first and second operation modes based on the operating environment (e.g., an output from an environmental sensor). In an example of FIG. 8, the mode selection signal MSEL may be provided to the second buffer 1030, and a part of the compensation circuit 1102 and the sampling circuit 1202 may be disabled or deactivated in the second operation mode by disabling or turning off the second buffer 1030.

As described above, the receiver 1002 may be implemented in the loop-unrolling structure such that the compensation circuit 1102 and the sampling circuit 1202 pre-calculate all possible decision results and generate output candidates based thereon and the output circuit 1302 selects one of the output candidates as a final output value.

In some example embodiments, as will be described with reference to FIG. 10, the output circuit 1302 may select or determine an output value of the loop-unrolling structure based on the first and second bits MSB1 and LSB1. In this example, the number of multiplexers and flip-flops may be reduced, and a load at an input-end viewed through the buffer may be reduced.

Figure 9:
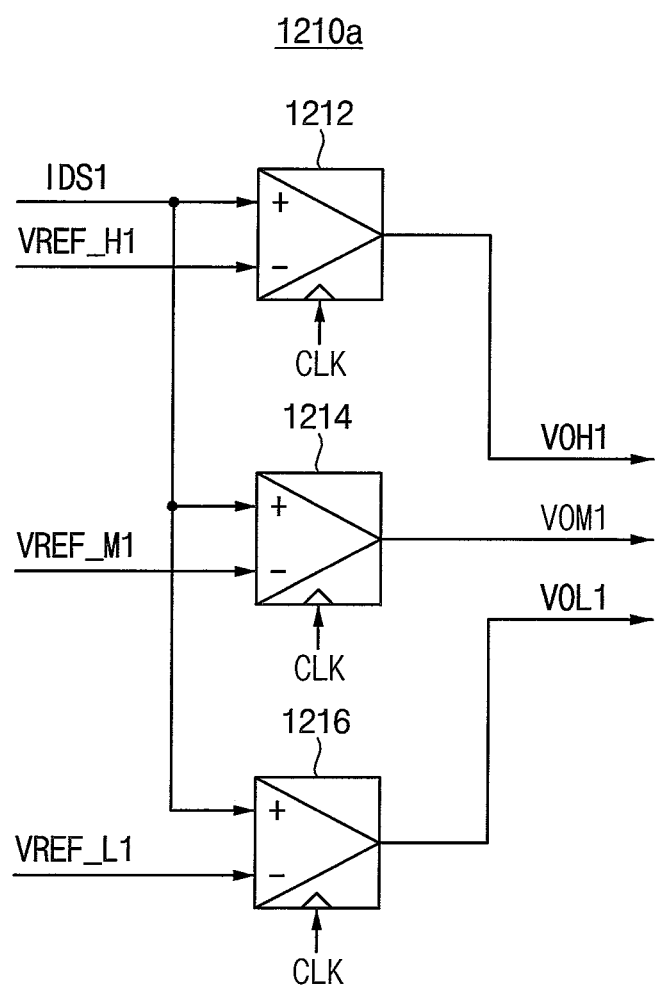
FIG. 9 is a block diagram illustrating an example of a first slicer included in a receiver of FIG. 8, according to some embodiments.

FIG. 9 is a block diagram illustrating an example of a first slicer included in a receiver of FIG. 8.

Referring to FIG. 9, a first slicer 1210a may include comparators 1212, 1214 and 1216 each of which operates based on a clock signal CLK.

The comparator 1212 may generate the first decision value VOH1 by comparing the first data signal IDS1 with the first compensation reference level VREF_H1. The comparator 1214 may generate the second decision value VOM1 by comparing the first data signal IDS1 with the second compensation reference level VREF_M1. The comparator 1216 may generate the third decision value VOL1 by comparing the first data signal IDS1 with the third compensation reference level VREF_L1. As will be described with reference to FIG. 15A, each of the remaining slicers 1220, 1230 and 1240 may have a structure substantially the same as that of the first slicer 1210a.

Figure 10:
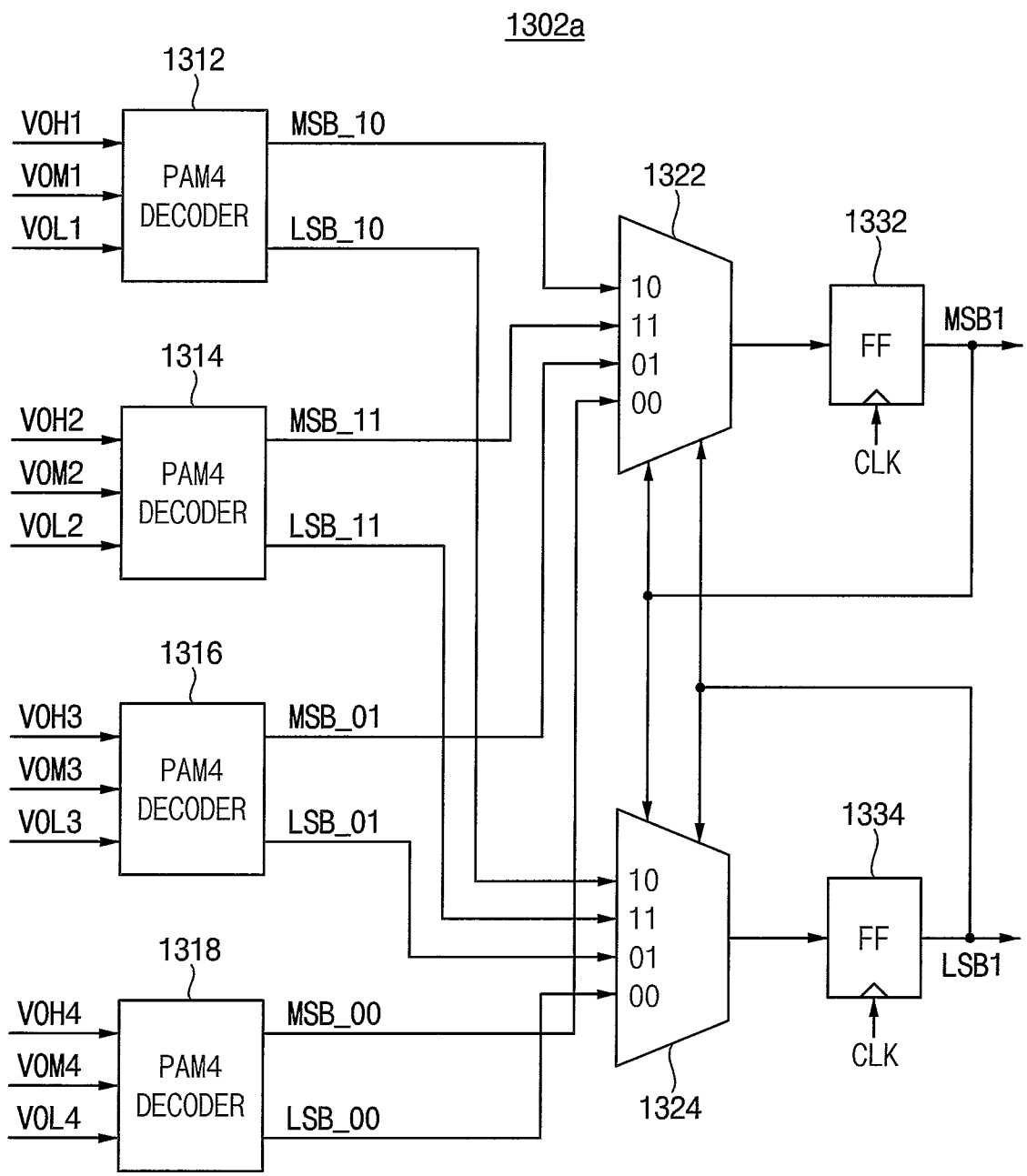
FIG. 10 is a block diagram illustrating an example of an output circuit included in a receiver of FIG. 8, according to some embodiments.

FIG. 10 is a block diagram illustrating an example of an output circuit included in a receiver of FIG. 8.

Referring to FIG. 10, an output circuit 1302a may include a first decoder 1312, a second decoder 1314, a third decoder 1316, a fourth decoder 1318, a first multiplexer 1322 and a second multiplexer 1324. The output circuit 1302a may further include flip-flops (FF) 1332 and 1334 each of which operates based on the clock signal CLK.

The first decoder 1312 may generate a first MSB MSB_10 and a first LSB LSB_10 based on the first, second and third decision values VOH1, VOM1 and VOL1. The second decoder 1314 may generate a second MSB MSB_11 and a second LSB LSB_11 based on the fourth, fifth and sixth decision values VOH2, VOM2 and VOL2. The third decoder 1316 may generate a third MSB MSB_01 and a third LSB LSB_01 based on the seventh, eighth and ninth decision values VOH3, VOM3 and VOL3. The fourth decoder 1318 may generate a fourth MSB MSB_00 and a first LSB LSB_00 based on the tenth, eleventh and twelfth decision values VOH4, VOM4 and VOL4. For example, each of the decoders 1312, 1314, 1316 and 1318 may be a PAM4 decoder.

The first multiplexer 1322 may output the first bit (e.g., MSB) MSB1 of the output data ODAT1 by selecting one of the first, second, third and fourth MSBs MSB_10, MSB_11, MSB_01 and MSB_00. The second multiplexer 1324 may output the second bit (e.g., LSB) LSB1 of the output data ODAT1 by selecting one of the first, second, third and fourth LSBs LSB_10, LSB_11, LSB_01 and LSB_00. The first and second bits MSB1 and LSB1 of the output data ODAT1 may be synchronized with the clock signal CLK by the flip-flops 1332 and 1334.

FIGS. 11A, 11B, 11C, 12A, 12B and 12C are diagrams for describing an operation of a receiver of FIG. 8.

Figure 11A:
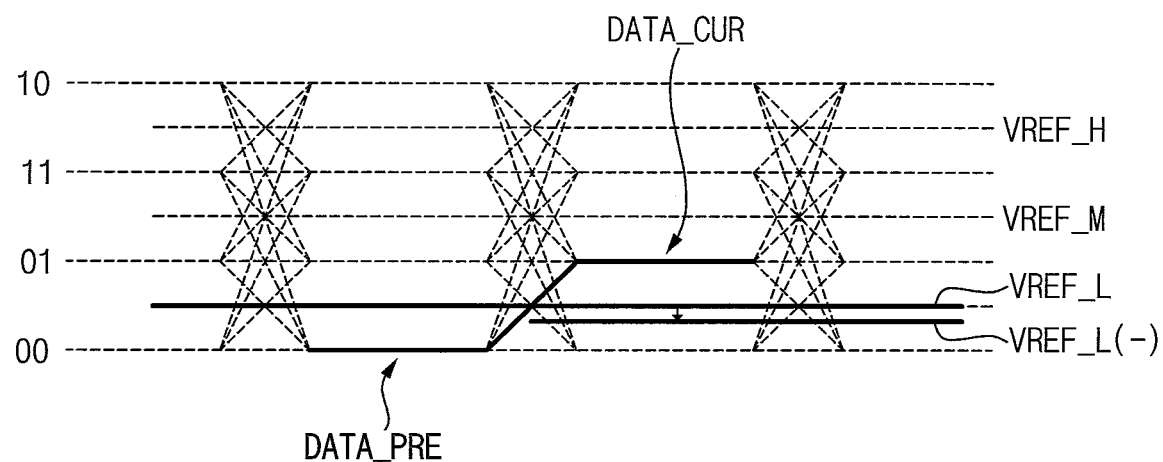
Figure 11B:
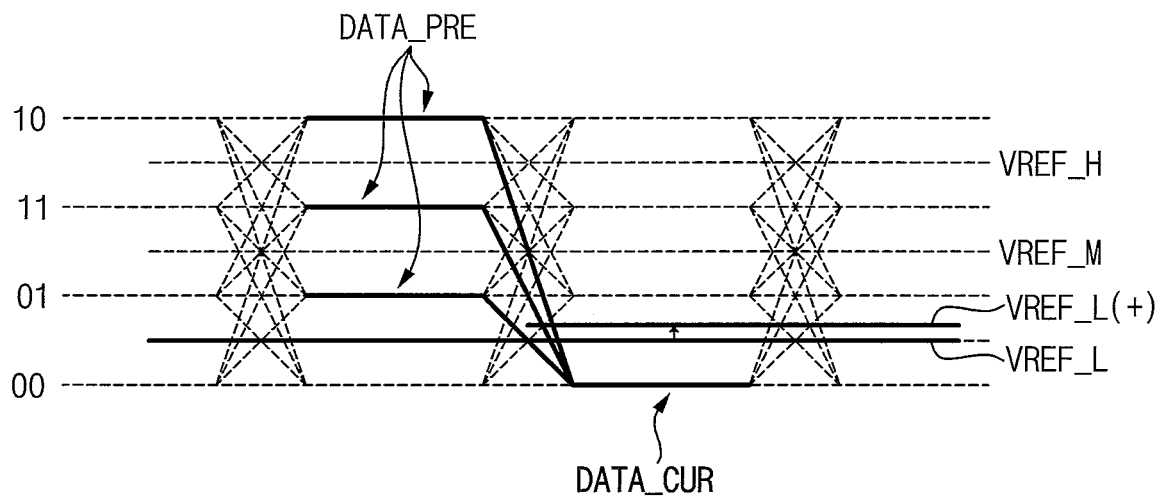

Referring to FIGS. 11A and 11B, the equalization for the third reference level VREF_L is illustrated.

As illustrated in FIG. 11A, when the previous data, e.g., the previous value DATA_PRE of the output data ODAT1 is '00', the equalization may be performed such that a lower compensation reference level VREF_L(−) is formed by decreasing the third reference level VREF_L, and thus the sensing margin of the slicer for sensing the current data, e.g., a current value DATA_CUR of the output data ODAT1 may be increased or improved.

As illustrated in FIG. 11B, when the previous value DATA_PRE of the output data ODAT1 is '10', '11' or '01', the equalization may be performed such that a higher compensation reference level VREF_L(+) is formed by increasing the third reference level VREF_L, and thus the sensing margin of the slicer for sensing the current value DATA_CUR of the output data ODAT1 may be increased or improved.

Referring to FIG. 11C, an operation of the receiver 1002 in a first operation mode MODE1 and a change VREF CHANGE in the reference level in the first operation mode MODE1 are illustrated.

In the first operation mode MODE1, all of the post-cursor cancellers 1110~1140 and the slicers 1210~1240 may be enabled, and each of the multiplexers 1322 and 1324 may select one of all input values based on both the first and second bits MSB1 and LSB1. For example, when the previous value DATA_PRE of the output data ODAT1 is '10', the multiplexers 1322 and 1324 may select and output the first MSB MSB_10 and the first LSB LSB_10, respectively.

In the first operation mode MODE1, the equalization may be performed such that the increasing and/or decreasing directions for the reference levels and the amount of change in the reference levels are different with respect to all possible cases. In FIG. 11C, decision results obtained by comparing the previous value DATA_PRE of the output data ODAT1 with the reference levels VREF_H, VREF_M and VREF_L are represented by VOH, VOM and VOL, respectively, and the changes in the reference levels VREF_H, VREF_M and VREF_L obtained by performing the equalization based on the previous value DATA_PRE are illustrated. In a table of FIG. 11C, signs of '+' and '−' represent the increasing and decreasing directions of the reference levels, and the number of signs represents the amount of change in the reference levels. For example, when the previous value DATA_PRE is '10', the first reference level VREF_H may be increased by a first level, as illustrated by '+'. When the previous value DATA_PRE is '11', the first reference level VREF_H may be decreased by a second level different from the first level, as illustrated by '−'. When the previous value DATA_PRE is '01', the first reference level VREF_H may be decreased by a third level greater than the second level, as illustrated by '−−'. When the previous value DATA_PRE is '00', the first reference level VREF_H may be decreased by a fourth level greater than the third level, as illustrated by '−−−'. As described above, the increasing and/or decreasing directions for the reference levels and the amount of change in the reference levels may be different for all cases.

As a result, in the first operation mode MODE1, the equalization may be performed on one reference level, which is used to sense the same voltage level of the multi-level signal, by different levels and/or directions depending on the previous value DATA_PRE (e.g., VREF_H may be differently changed by '−−−', '−' and '+' when DATA_PRE is '00', '01', '11' and '10', respectively). In addition, in the first operation mode MODE1, the equalization may be performed on different reference levels, which are used when the previous value DATA_PRE corresponds to the same value, by different levels and/or directions (e.g., VREF_H, VREF_M and VREF_L may be differently changed by '−−−', and '−' when DATA_PRE is '00').

In some embodiments, the amount of changes in the reference levels may be determined as four cases depending on the previous data in the PAM4 scheme, each of the three slicers should perform the calculations for all four cases in the loop-unrolling structure, and thus the total of twelve (=4*3) calculations may be performed in the first operation mode MODE1.

Figure 12A:
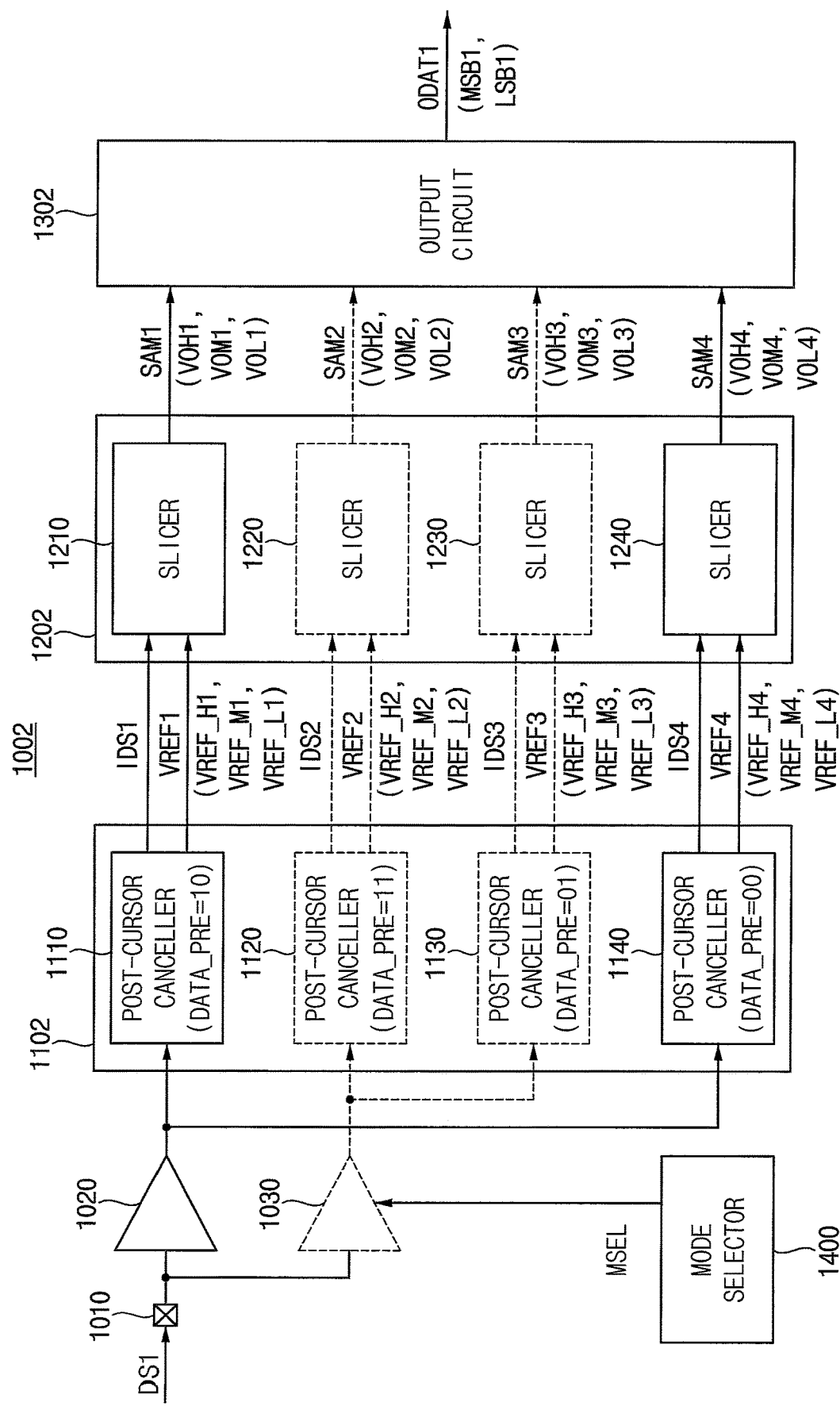
Figure 12B:
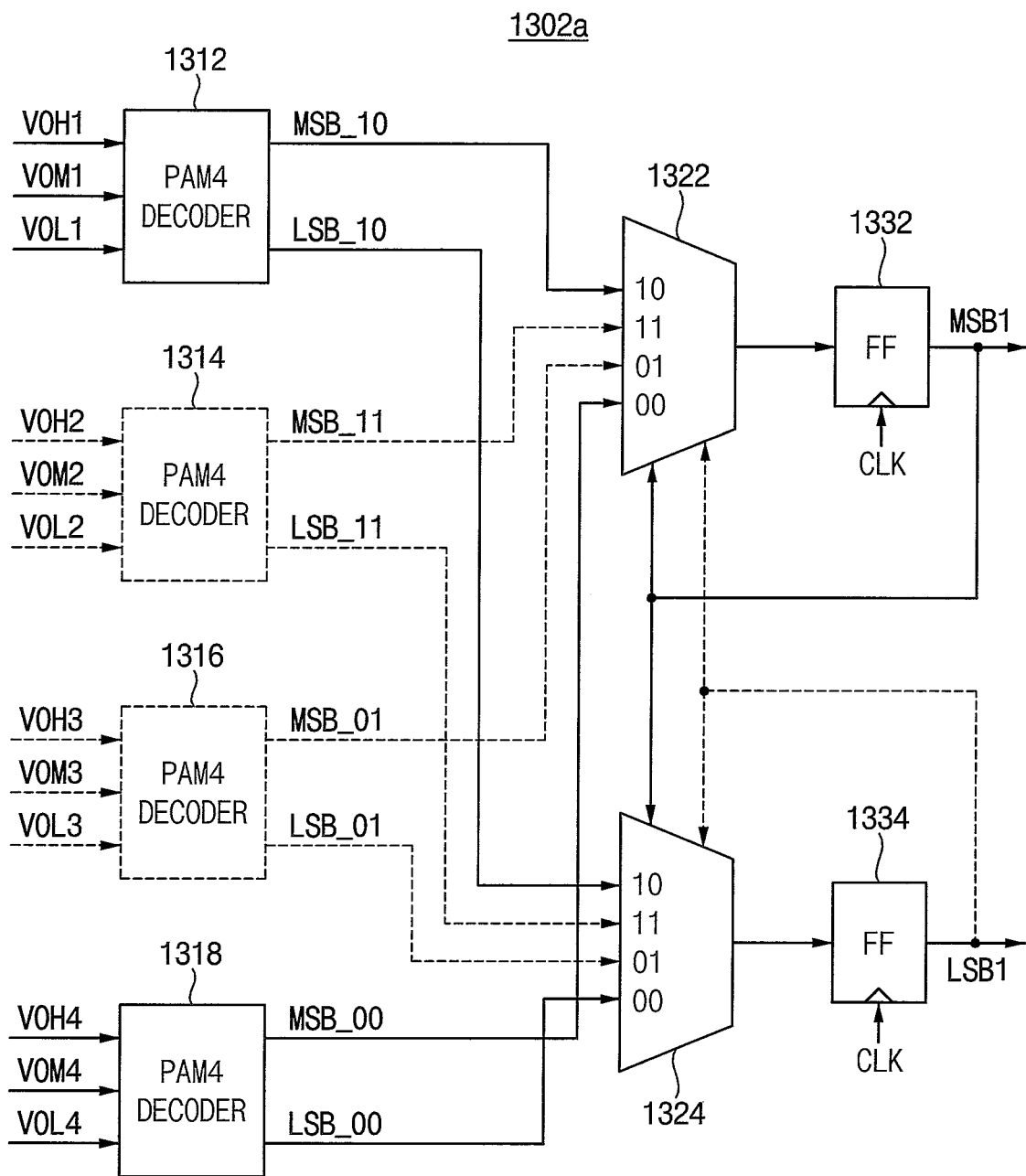

Referring to FIGS. 12A, 12B and 12C, an operation of the receiver 1002 in a second operation mode MODE2 and a change VREF CHANGE in the reference level in the second operation mode MODE2 are illustrated.

As illustrated in FIGS. 12A and 12B, in the second operation mode MODE2, the second buffer 1030 may be disabled based on the mode selection signal MSEL. Therefore, the post-cursor cancellers 1120 and 1130, the slicers 1220 and 1230 and the decoders 1314 and 1316 may be disabled, and only the post-cursor cancellers 1110 and 1140, the slicers 1210 and 1240 and the decoders 1312 and 1318 may be enabled. In FIGS. 12A and 12B, disabled components are illustrated by dotted lines. The multiplexer 1322 may select one of the first and fourth MSBs MSB_10 and MSB_00 based on the first bit MSB1, and the multiplexer 1324 may select one of the first and fourth LSBs LSB_10 and LSB_00 based on the first bit MSB1. For example, when the first bit MSB1 is '0', the multiplexers 1322 and 1324 may select and output the fourth MSB MSB_00 and the fourth LSB LSB_00, respectively.

As illustrated in FIG. 12C, in the second operation mode MODE2, the equalization may be performed such that the increasing and/or decreasing directions for the reference levels and the amount of change in the reference levels are the same with respect to at least some of all possible cases. The descriptions repeated with FIG. 11C will be omitted. For example, when the previous value DATA_PRE is '10', the first reference level VREF_H may be increased by the first level, as illustrated by '+'. When the previous value DATA_PRE is '11', '01' and '00', the first reference level VREF_H may be decreased by the second level, as illustrated by '−'. For example, when the first level and the second level is the same, the amount of change in the reference levels may be the same for all cases, and only the increasing and/or decreasing directions for the reference levels may be different for some cases. When the previous value DATA_PRE is '11', '01' and '00', the amount of change in the first reference level VREF_H may be different in the first operation mode MODE1, as illustrated by '-', '--' and '---', however, the amount of change in the first reference level VREF_H may be the same in the second operation mode MODE2, as illustrated by '-'.

As a result, in the second operation mode MODE2, the equalization may be performed on one reference level, which is used to sense the same voltage level of the multi-level signal, by the same level and direction depending on the previous value DATA_PRE (e.g., VREF_H may be changed by '-' when DATA_PRE is '11', '01' and '00'). In addition, in the second operation mode MODE2, the equalization may be performed on different reference levels, which are used when the previous value DATA_PRE corresponding to the same value, by the same level and direction (e.g., VREF_H, VREF_M and VREF_L may be changed by '-' when DATA_PRE is '00').

For example, if a desired equalization performance is achieved even though only the increasing and/or decreasing directions for the reference levels are controlled or adjusted without controlling or adjusting the amount of change in the reference levels, the calculations may be performed only for the increasing and/or decreasing directions, and thus only six (=2*3) calculations may be performed in the second operation mode MODE2.

Although example embodiments are described based on when the post-cursor cancellers 1110 and 1140 and the slicers 1210 and 1240 are enabled in the second operation mode MODE2, example embodiments are not limited thereto. For example, in the second operation mode MODE2, any two post-cursor cancellers among the post-cursor cancellers 1110~1140 and any two slicers among the slicers 1210~1240 may be enabled.

Figure 13:
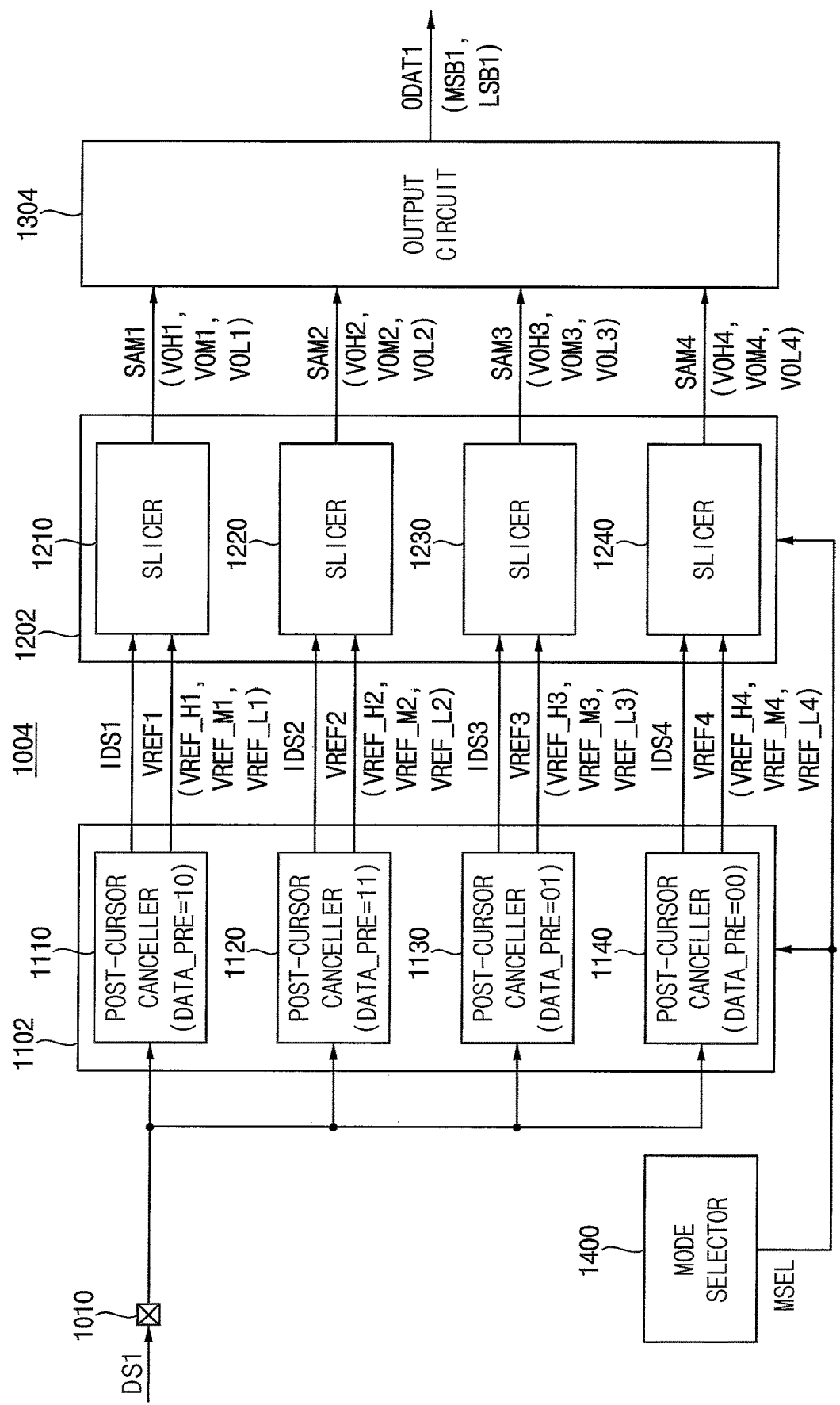
FIG. 13 is a block diagram illustrating another example of a receiver of FIG. 1, according to some embodiments.

FIG. 13 is a block diagram illustrating another example of a receiver of FIG. 1. The descriptions repeated with FIG. 8 will be omitted.

Referring to FIG. 13, a receiver 1004 includes a compensation circuit 1102, a sampling circuit 1202, an output circuit 1304 and a mode selector 1400. The receiver 1004 may further include a data input pad 1010.

The data input pad 1010, the compensation circuit 1102, the sampling circuit 1202 and the mode selector 1400 may be substantially the same as those described with reference to FIGS. 8 and 9.

The output circuit 1304 may generate the output data ODAT1 including the first and second bits MSB1 and LSB1 based on the first through twelfth decision values VOH1~VOH4, VOM1~VOM4 and VOL1~VOL4.

In some example embodiments, as will be described with reference to FIG. 14, the output circuit 1304 may select or determine an output value of the loop-unrolling structure based on some of the decision values VOH1~VOH4, VOM1~VOM4 and VOL1~VOL4. In this example, the number of decoders may be reduced, and a DFE delay may be reduced or minimized.

The mode selector 1400 may generate the mode selection signal MSEL used to select one of the first and second operation modes based on the operating environment. In an example of FIG. 13, the mode selection signal MSEL may be directly provided to the compensation circuit 1102 and the sampling circuit 1202, and a part of the compensation circuit 1102 and the sampling circuit 1202 may be disabled or deactivated in the second operation mode.

Figure 14:
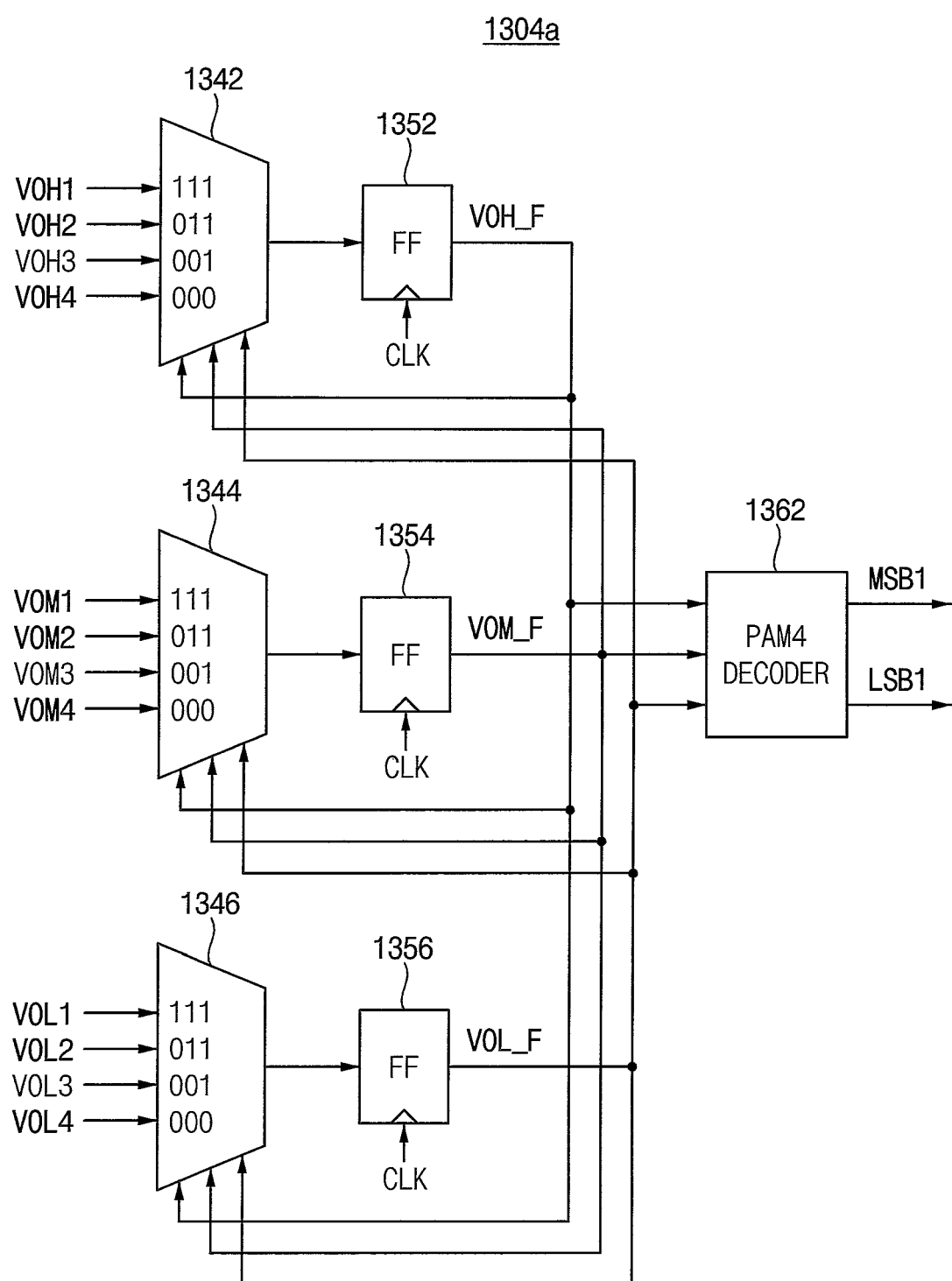
FIG. 14 is a block diagram illustrating an example of an output circuit included in a receiver of FIG. 13, according to some embodiments.

FIG. 14 is a block diagram illustrating an example of an output circuit included in a receiver of FIG. 13.

Referring to FIG. 14, an output circuit 1304a may include a first multiplexer 1342, a second multiplexer 1344, a third multiplexer 1346 and a decoder 1362. The output circuit 1304a may further include flip-flops 1352, 1354 and 1356 each of which operates based on the clock signal CLK.

The first multiplexer 1342 may output a first final decision value VOH_F by selecting one of the first, fourth, seventh and tenth decision values VOH1~VOH4. The second multiplexer 1344 may output a second final decision value VOM_F by selecting one of the second, fifth, eighth and eleventh decision values VOM1~VOM4. The third multiplexer 1346 may output a third final decision value VOL_F by selecting one of the third, sixth, ninth and twelfth decision values VOL1~VOL4. The first, second and third final decision values VOH_F, VOM_F and VOL_F may be synchronized with the clock signal CLK by the flip-flops 1352, 1354 and 1356. The decoder 1362 may generate the first and second bits MSB1 and LSB1 of the output data ODAT1 based on the first, second and third final decision values VOH_F, VOM_F and VOL_F. For example, the decoder 1362 may be a PAM4 decoder.

Figure 15A:
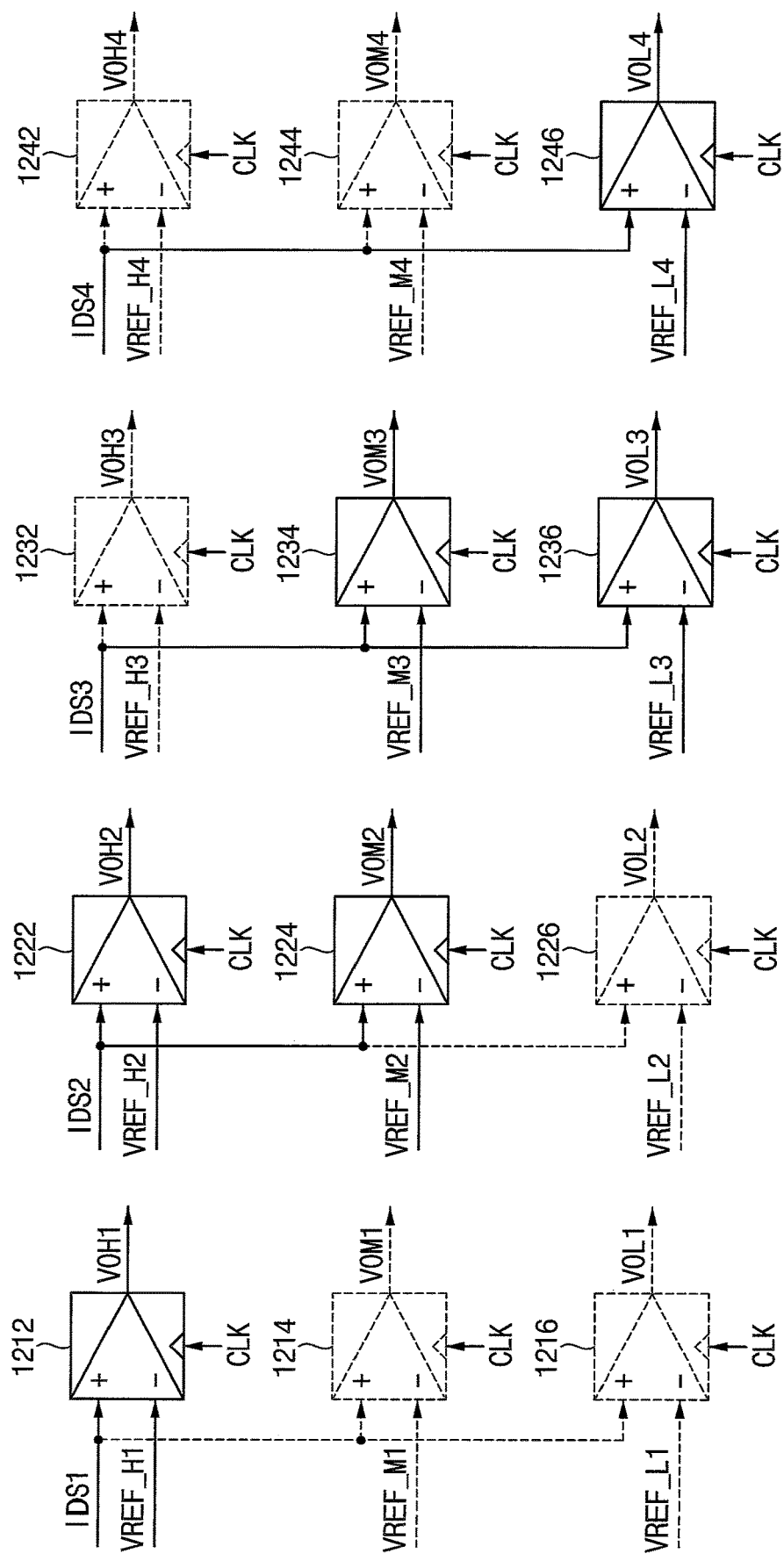
FIGS. 15A and 15B are diagrams for describing an operation of a receiver of FIG. 13, according to some embodiments.
Figure 15B:
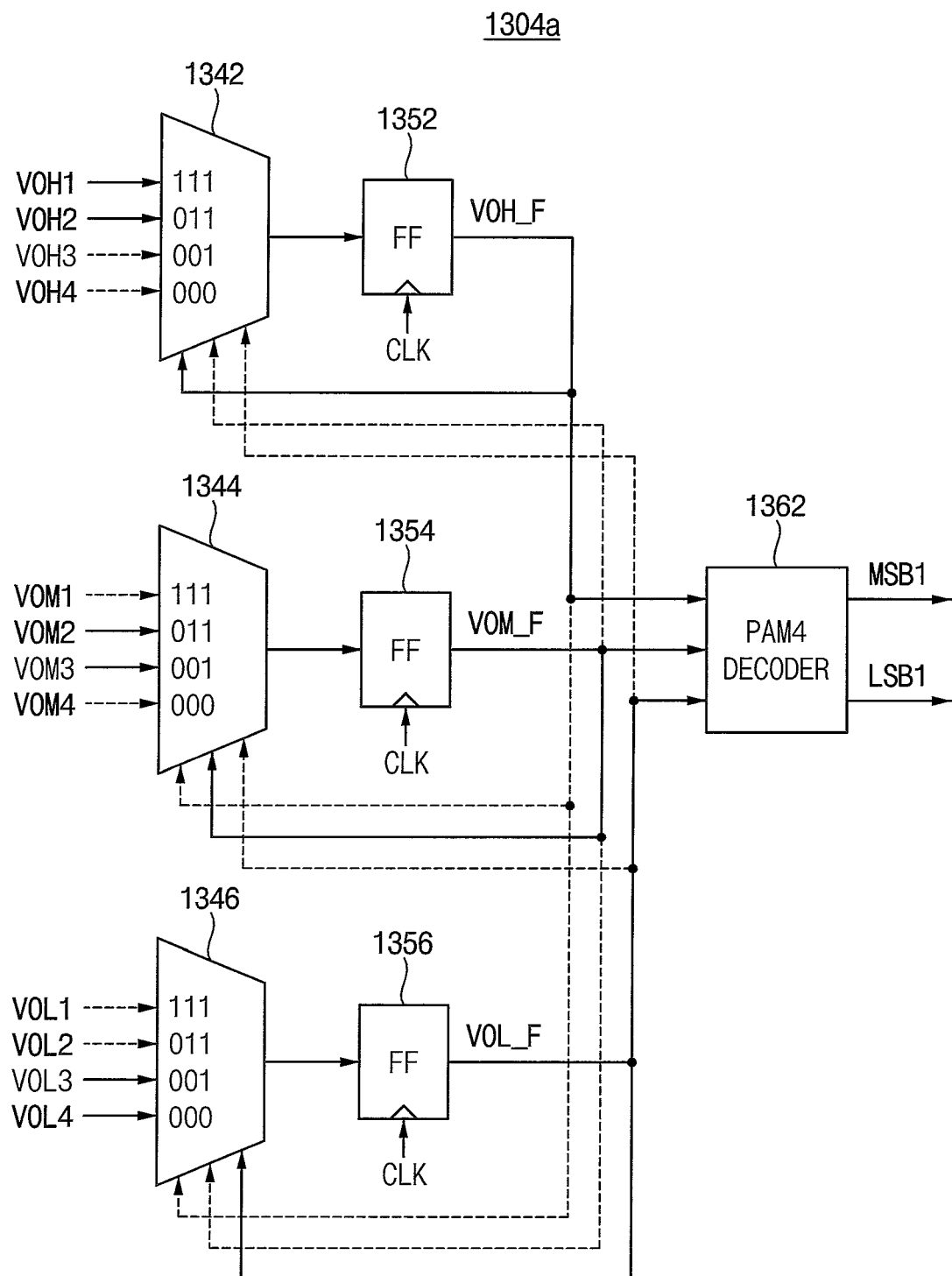

FIGS. 15A and 15B are diagrams for describing an operation of a receiver of FIG. 13.

In the first operation mode MODE1, all of the post-cursor cancellers 1110~1140 and the slicers 1210~1240 may be enabled, and each of the multiplexers 1342, 1344 and 1346 may select one of all input values based on all of the first, second and third final decision values VOH_F, VOM_F and VOL_F. For example, when the previous value DATA_PRE of the output data ODAT1 is '10' and when all of the first, second, and third final decision values VOH_F, VOM_F and VOL_F are '1', the multiplexers 1342, 1344 and 1346 may select and output the first decision value VOH1, the second decision value VOM1 and the third decision value VOL1, respectively.

Referring to FIGS. 15A and 15B, in the second operation mode MODE2, only some parts of the post-cursor cancellers 1110~1140 and the slicers 1210~1240 may be enabled and the other parts of the post-cursor cancellers 1110~1140 and the slicers 1210~1240 may be disabled based on the mode selection signal MSEL, and some of paths included in the output circuit 1304a may be disabled.

For example, as illustrated in FIG. 15A, among the comparators 1212, 1214 and 1216 included in the slicer 1210, only the comparator 1212 may be enabled. Among comparators 1222, 1224 and 1226 included in the slicer 1220, only the comparators 1222 and 1224 may be enabled. Among comparators 1232, 1234 and 1236 included in the slicer 1230, only the comparators 1234 and 1236 may be enabled. Among comparators 1242, 1244 and 1246 included in the slicer 1240, only the comparator 1246 may be enabled. In some example embodiments, some components of the post-cursor cancellers 1110~1140 that generate inputs of the disabled comparators 1214, 1216, 1226, 1232, 1242 and 1244 may also be disabled.

In addition, as illustrated in FIG. 15B, the multiplexer 1342 may select one of the first and fourth decision values VOH1 and VOH2 based on the first final decision value VOH_F. The multiplexer 1344 may select one of the fifth and eighth decision values VOM2 and VOM3 based on the second final decision value VOM_F. The multiplexer 1346 may select one of the ninth and twelfth decision values VOL3 and VOL4 based on the third final decision value VOL_F. For example, when the previous value DATA_PRE of the output data ODAT1 is '00' and when all of the first, second, and third final decision values VOH_F, VOM_F and VOL_F are '0', the multiplexers 1342, 1344 and 1346 may select and output the fourth decision value VOH2, the eighth decision value VOM3 and the twelfth decision value VOL4, respectively.

A change in the reference level based on the equalization of the receiver 1004 in the second operation mode MODE2 may be substantially the same as that described with reference to FIG. 12C.

Although not illustrated in detail, in the PAM8 scheme, the compensation circuit may include eight post-cursor cancellers, the sampling circuit may include eight slicers, each slicer may include seven comparators, and the output circuit may select or determine an output value based on bits or decision values of the output data.

Figure 16:
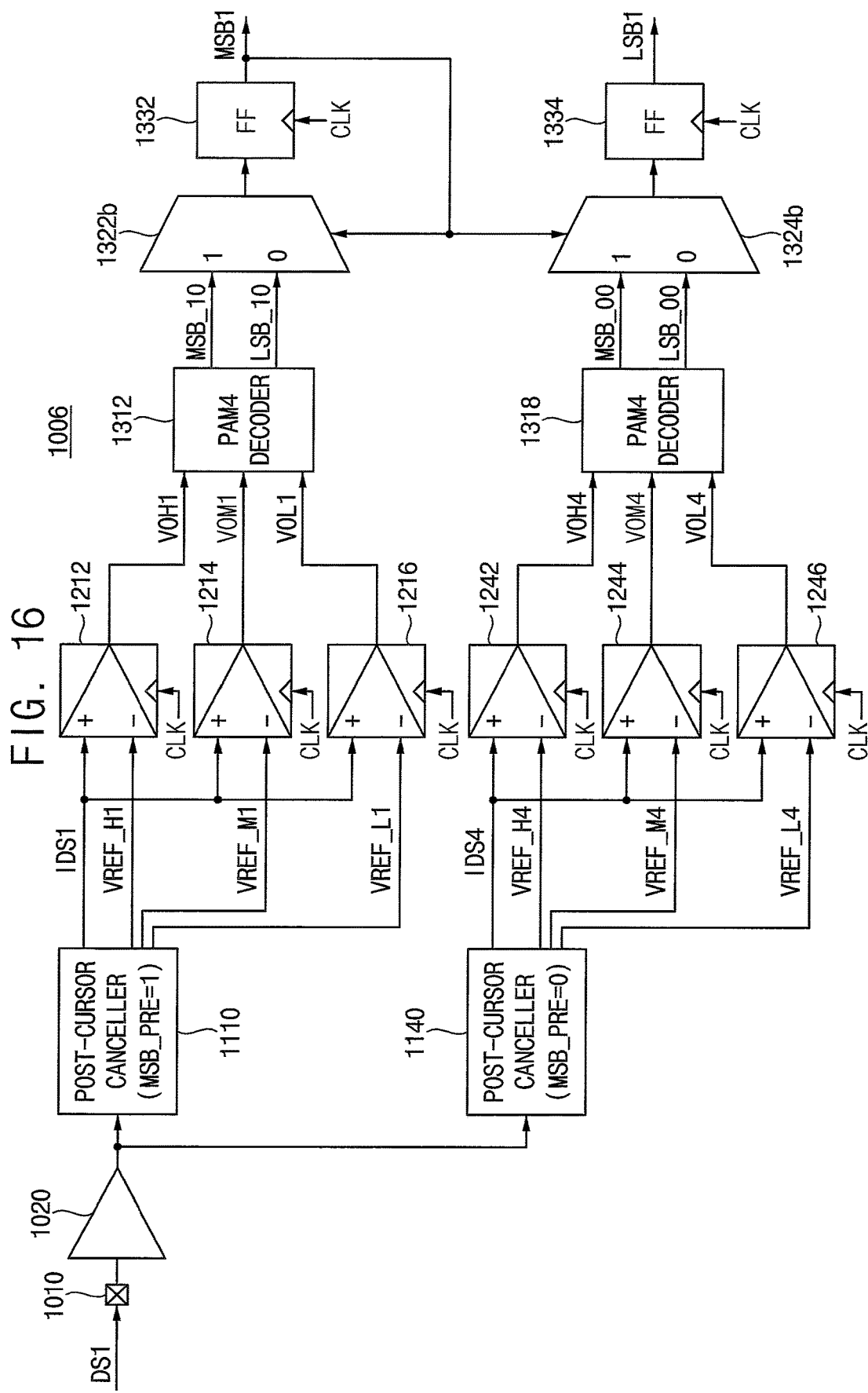
FIGS. 16 and 17 are block diagrams illustrating a receiver according to example embodiments.
Figure 17:
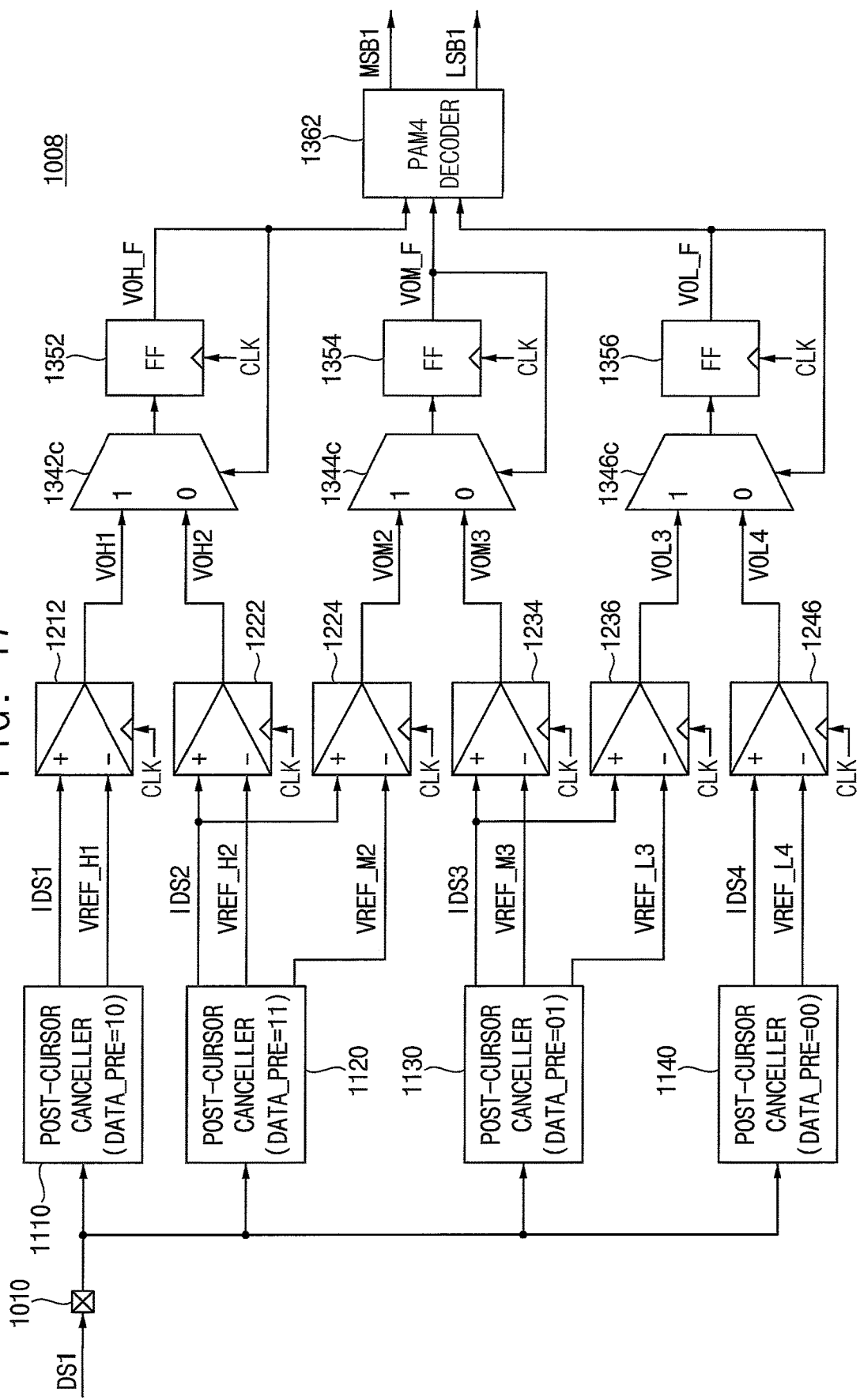

FIGS. 16 and 17 are block diagrams illustrating a receiver according to example embodiments. The descriptions repeated with FIGS. 8, 9, 10, 12A, 12B, 12C, 13, 14, 15A and 15B will be omitted.

Referring to FIG. 16, a receiver 1006 may include a data input pad 1010, a buffer 1020, post-cursor cancellers 1110 and 1140, comparators 1212, 1214, 1216, 1242, 1244 and 1246, decoders 1312 and 1318, multiplexers 1322b and 1324b, and flip-flops 1332 and 1334.

The receiver 1006 may include only components enabled in the second operation mode among the components included in the receiver 1002 of FIG. 8. For example, the post-cursor cancellers 1110 and 1140 may form a compensation circuit, the comparators 1212, 1214, 1216, 1242, 1244 and 1246 may form a sampling circuit, and the decoders 1312 and 1318, the multiplexers 1322b and 1324b and the flip-flops 1332 and 1334 may form an output circuit. Operations of the components may be substantially the same as those described with reference to FIGS. 8, 9, 10, 12A, 12B and 12C.

Referring to FIG. 17, a receiver 1008 may include a data input pad 1010, post-cursor cancellers 1110, 1120, 1130 and 1140, comparators 1212, 1222, 1224, 1234, 1236 and 1246, multiplexers 1342c, 1344c and 1346c, flip-flops 1352, 1354 and 1356, and a decoder 1362.

The receiver 1008 may include only components enabled in the second operation mode among the components included in the receiver 1004 of FIG. 13. For example, the post-cursor cancellers 1110, 1120, 1130 and 1140 may form a compensation circuit, the comparators 1212, 1222, 1224, 1234, 1236 and 1246 may form a sampling circuit, and the multiplexers 1342c, 1344c and 1346c, the flip-flops 1352, 1354 and 1356 and the decoder 1362 may form an output circuit. Operations of the components may be substantially the same as those described with reference to FIGS. 13, 14, 15A and 15B.

If the loop-unrolling structure is required for the timing margin and a higher performance of equalization is not required, the receiver according to example embodiments may be implemented as a loop-unrolling DFE in which only the second operation mode is applied, as illustrated in FIGS. 16 and 17, thereby reducing the circuit size and power consumption. In this example, as illustrated with reference to FIG. 12C, the equalization may be performed on the plurality of compensation reference levels such that all of the plurality of compensation reference levels are changed by the same level, and the direction of the equalization may be determined based on the previous value of the output data.

Figure 18:
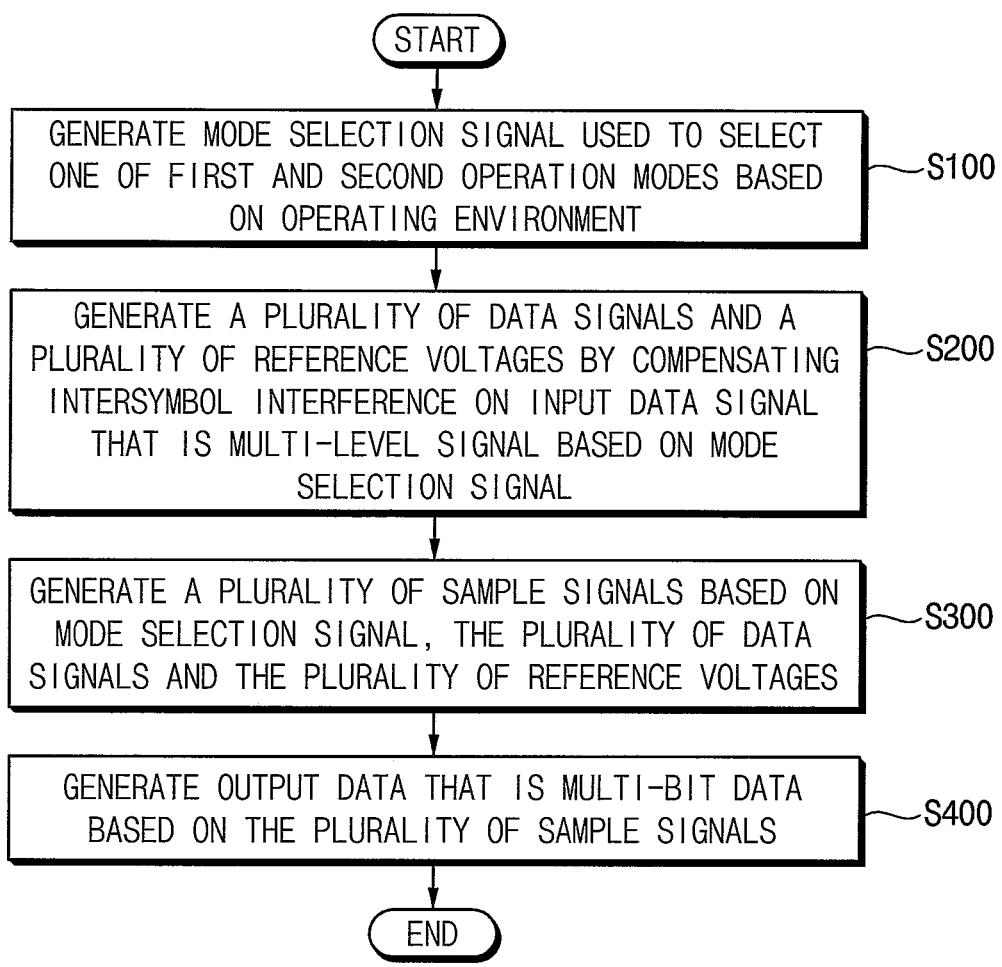
FIG. 18 is a flowchart illustrating a method of receiving data according to example embodiments.

FIG. 18 is a flowchart illustrating a method of receiving data according to example embodiments.

Referring to FIGS. 1 and 18, a method of receiving data according to example embodiments is performed by the receiver 1000 according to example embodiments.

In the method of receiving data according to example embodiments, the mode selection signal MSEL is generated based on the operating environment (step S100). The mode selection signal MSEL is used to select one of the first and second operation modes based on the operating environment. The plurality of data signals IDS and the plurality of reference voltages VREF are generated, by the compensation circuit 1100, by compensating intersymbol interference on the input data signal DS that is the multi-level signal based on the mode selection signal MSEL (step S200). The plurality of sample signals SAM are generated, by the sampling circuit 1200, based on the mode selection signal MSEL, the plurality of data signals IDS and the plurality of reference voltages VREF (step S300). The output data ODAT including two or more bits is generated based on the plurality of sample signals SAM (step S400). The current value of the output data is selected based on a previous value of the output data. The compensation circuit 1100 and the sampling circuit 1200 are entirely enabled in the first operation mode, and the compensation circuit 1100 and the sampling circuit 1200 are partially enabled in the second operation mode.

Figure 19:
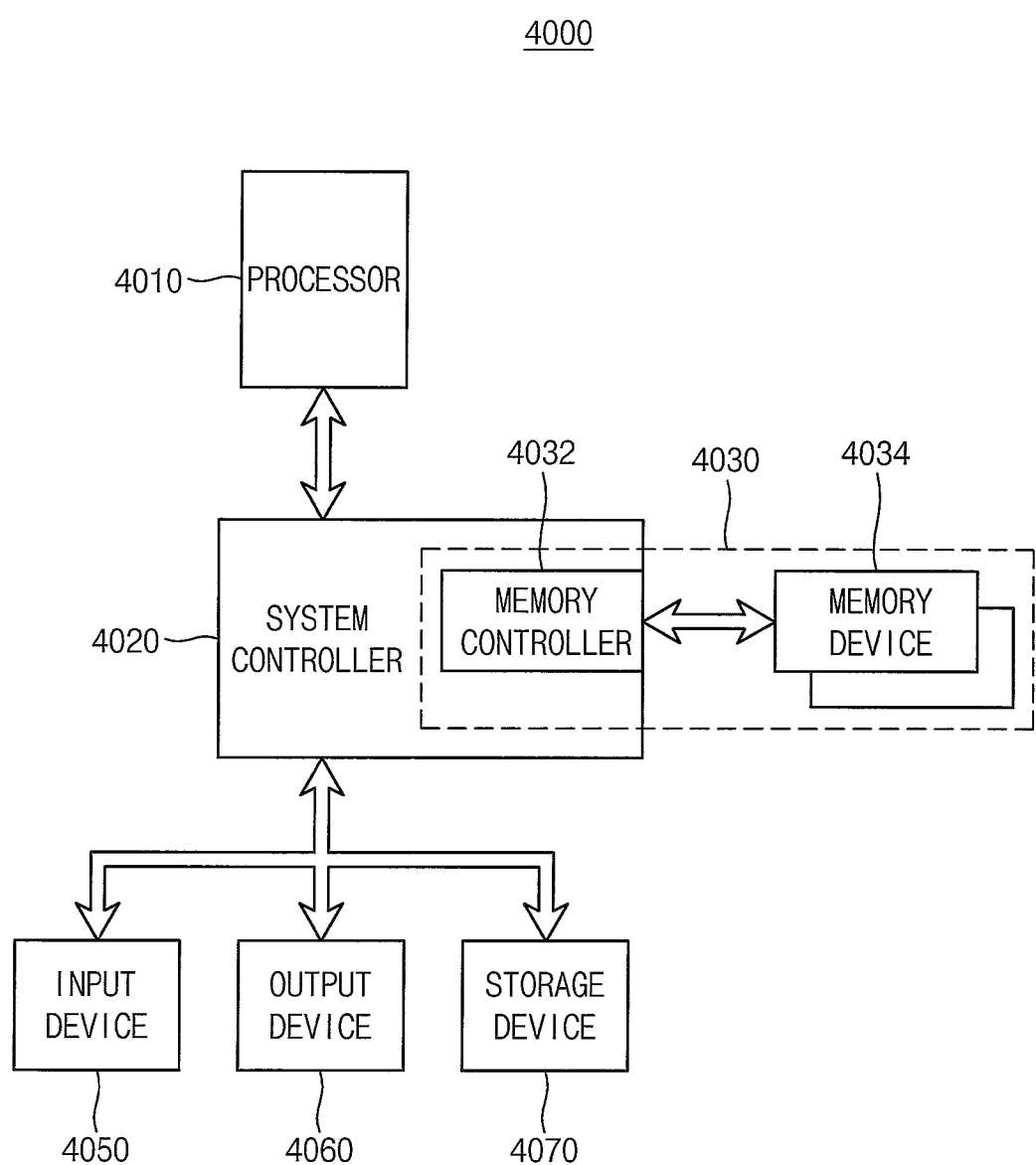
FIG. 19 is a block diagram illustrating a computing system according to example embodiments.

FIG. 19 is a block diagram illustrating a computing system according to example embodiments.

Referring to FIG. 19, a computing system 4000 includes a processor 4010, a system controller 4020 and a memory system 4030. The computing system 4000 may further include an input device 4050, an output device 4060 and a storage device 4070.

The memory system 4030 includes a plurality of memory devices 4034, and a memory controller 4032 for controlling the memory devices 4034. The memory controller 4032 may be included in the system controller 4020. The memory system 4030 may be the memory system according to example embodiments, and may include the receiver according to example embodiments.

The processor 4010 may perform various computing functions, such as executing specific software instructions for performing specific calculations or tasks. The processor 4010 may be connected to the system controller 4020 via a processor bus. The system controller 4020 may be connected to the input device 4050, the output device 4060 and the storage device 4070 via an expansion bus. As such, the processor 4010 may control the input device 4050, the output device 4060 and the storage device 4070 using the system controller 4020.

Figure 20:
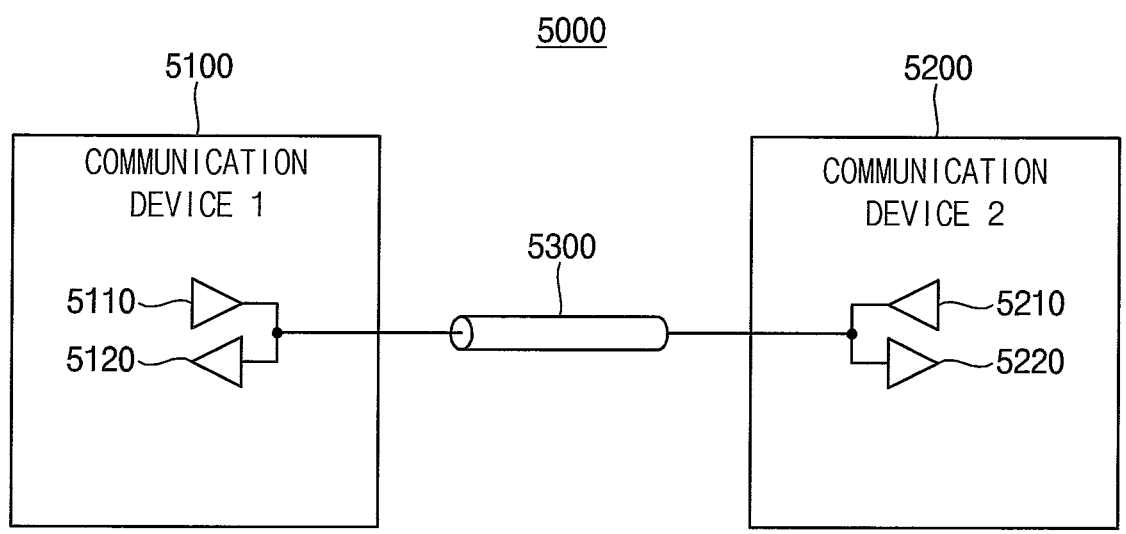
FIG. 20 is a block diagram illustrating a communication system according to example embodiments.

FIG. 20 is a block diagram illustrating a communication system according to example embodiments.

Referring to FIG. 20, a communication system 5000 includes a first communication device 5100, a second communication device 5200 and a channel 5300.

The first communication device 5100 includes a first transmitter 5110 and a first receiver 5120. The second communication device 5200 includes a second transmitter 5210 and a second receiver 5220. The first transmitter 5110 and the first receiver 5120 are connected to the second transmitter 5210 and the second receiver 5220 through the channel 5300. The receivers 5120 and 5220 may be the receiver according to example embodiments. In some example embodiments, each of the first and second communication devices 5100 and 5200 may include a plurality of transmitters and a plurality of receivers, and the communication system 5000 may include a plurality of channels for connecting the plurality of transmitters and a plurality of receivers.

The inventive concept may be applied to various electronic devices and systems that include the memory devices and the memory systems. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A receiver configured to receive a multi-level signal having three or more voltage levels that are different from each other, comprising:
    a compensation circuit configured to generate a plurality of data signals and a plurality of reference voltages by compensating intersymbol interference (ISI) on an input data signal that is the multi-level signal, each of the plurality of reference voltages including a plurality of compensation reference levels;
    a sampling circuit configured to generate a plurality of sample signals based on the plurality of data signals and the plurality of reference voltages, each of the plurality of sample signals including a plurality of decision values;
    an output circuit configured to generate output data based on the plurality of sample signals, and to select a current value of the output data based on a previous value of the output data, the output data including two or more bits that are different from each other; and
    a mode selector configured to generate a mode selection signal used to select one of a first operation mode and a second operation mode based on an operating environment,
    wherein the receiver is configured such that:
        in the first operation mode, an equalization is performed on first compensation reference levels among the plurality of compensation reference levels such that all of the first compensation reference levels are changed by different amounts,
        in the second operation mode, the equalization is performed on the first compensation reference levels such that at least two of the first compensation reference levels are changed by the same amount, and
        the first compensation reference levels are used when the previous value of the output data corresponds to a first value.

2. The receiver of claim 1, further comprising:
    an environmental sensor configured to detect a change in the operating environment, and
    wherein the mode selector is configured to generate the mode selection signal based on an output of the environmental sensor.

3. The receiver of claim 1, wherein, the mode selector is configured to, when the receiver enters a training mode in which a training operation is performed based on an external command, generate the mode selection signal based on a result of the training operation.

4. The receiver of claim 1, wherein:
    the three or more voltage levels include a first voltage level, a second voltage level, a third voltage level, and a fourth voltage level that are different from each other, and
    the two or more bits include a first bit and a second bit that are different from each other.

5. The receiver of claim 4, wherein the compensation circuit includes:
    a first post-cursor canceller configured to generate a first data signal and a first reference voltage when the previous value of the output data corresponds to the fourth voltage level, the first reference voltage including first, second, and third compensation reference levels;
    a second post-cursor canceller configured to generate a second data signal and a second reference voltage when the previous value of the output data corresponds to the third voltage level, the second reference voltage including fourth, fifth, and sixth compensation reference levels;
    a third post-cursor canceller configured to generate a third data signal and a third reference voltage when the previous value of the output data corresponds to the second voltage level, the third reference voltage including seventh, eighth, and ninth compensation reference levels; and
    a fourth post-cursor canceller configured to generate a fourth data signal and a fourth reference voltage when the previous value of the output data corresponds to the first voltage level, the fourth reference voltage including tenth, eleventh, and twelfth compensation reference levels.

6. The receiver of claim 5, wherein the sampling circuit includes:
    a first slicer configured to generate a first sample signal by comparing the first data signal with the first, second, and third compensation reference levels, the first sample signal including first, second, and third decision values;
    a second slicer configured to generate a second sample signal by comparing the second data signal with the fourth, fifth, and sixth compensation reference levels, the second sample signal including fourth, fifth, and sixth decision values;
    a third slicer configured to generate a third sample signal by comparing the third data signal with the seventh, eighth, and ninth compensation reference levels, the third sample signal including seventh, eighth, and ninth decision values; and
    a fourth slicer configured to generate a fourth sample signal by comparing the fourth data signal with the tenth, eleventh, and twelfth compensation reference levels, the fourth sample signal including tenth, eleventh, and twelfth decision values.

7. The receiver of claim 6, wherein the output circuit includes:
a first decoder configured to generate a first most significant bit (MSB) and a first least significant bit (LSB) based on the first, second, and third decision values;
a second decoder configured to generate a second MSB and a second LSB based on the fourth, fifth, and sixth decision values;
a third decoder configured to generate a third MSB and a third LSB based on the seventh, eighth, and ninth decision values;
a fourth decoder configured to generate a fourth MSB and a fourth LSB based on the tenth, eleventh, and twelfth decision values;
a first multiplexer configured to output a MSB of the output data by selecting one of the first, second, third, and fourth MSBs; and
a second multiplexer configured to output a LSB of the output data by selecting one of the first, second, third, and fourth LSBs.

8. The receiver of claim 7, wherein:
in the first operation mode, all of the first, second, third, and fourth post-cursor cancellers, and the first, second, third, and fourth slicers are enabled, and
in the second operation mode, only the first and fourth post-cursor cancellers and the first and fourth slicers among the first, second, third, and fourth post-cursor cancellers and the first, second, third, and fourth slicers are enabled.

9. The receiver of claim 8, further comprising:
a first buffer configured to buffer the input data signal and to provide the buffered input data signal to the first and fourth post-cursor cancellers; and
a second buffer configured to buffer the input data signal and to provide the buffered input data signal to the second and third post-cursor cancellers,
wherein the second buffer is disabled in the second operation mode.

10. The receiver of claim 6, wherein the output circuit includes:
a first multiplexer configured to output a first final decision value by selecting one of the first, fourth, seventh, and tenth decision values;
a second multiplexer configured to output a second final decision value by selecting one of the second, fifth, eighth, and eleventh decision values;
a third multiplexer configured to output a third final decision value by selecting one of the third, sixth, ninth, and twelfth decision values; and
a decoder configured to generate an MSB and an LSB of the output data based on the first, second, and third final decision values.

11. The receiver of claim 10, wherein:
In the first operation mode, the first, second, third, and fourth post-cursor cancellers and the first, second, third, and fourth slicers are entirely enabled, and
in the second operation mode, the first, second, third, and fourth post-cursor cancellers and the first, second, third, and fourth slicers are partially enabled.

12. A receiver configured to receive a multi-level signal having three or more voltage levels that are different from each other, comprising:
a compensation circuit configured to generate a plurality of data signals and a plurality of compensation reference levels by compensating intersymbol interference (ISI) on an input data signal that is the multi-level signal;
a sampling circuit configured to generate a plurality of decision values based on the plurality of data signals and the plurality of compensation reference levels; and
an output circuit configured to generate output data based on the plurality of decision values, and to select a current value of the output data based on a previous value of the output data, the output data including two or more bits that are different from each other,
wherein an equalization is performed on the plurality of compensation reference levels such that all of the plurality of compensation reference levels are changed by the same amount, and
wherein a direction of the equalization is determined based on the previous value of the output data.

13. The receiver of claim 12, wherein:
the three or more voltage levels include a first voltage level, a second voltage level, a third voltage level and a fourth voltage level that are different from each other, and
the two or more bits include a first bit and a second bit that are different from each other.

14. The receiver of claim 13, wherein the compensation circuit includes:
a first post-cursor canceller configured to generate a first data signal and first, second, and third compensation reference levels when a most significant bit (MSB) of the previous value of the output data corresponds to a first value; and
a second post-cursor canceller configured to generate a second data signal and fourth, fifth, and sixth compensation reference levels when the MSB of the previous value of the output data corresponds to a second value.

15. The receiver of claim 14, wherein the sampling circuit includes:
a first slicer configured to generate first, second, and third decision values by comparing the first data signal with the first, second, and third compensation reference levels; and
a second slicer configured to generate fourth, fifth, and sixth decision values by comparing the second data signal with the fourth, fifth, and sixth compensation reference levels.

16. The receiver of claim 15, wherein the output circuit includes:
A first decoder configured to generate a first MSB and a first least significant bit (LSB) based on the first, second, and third decision values;
a second decoder configured to generate a second MSB and a second LSB based on the fourth, fifth, and sixth decision values;
a first multiplexer configured to output a MSB of the output data by selecting one of the first and second MSBs; and
a second multiplexer configured to output a LSB of the output data by selecting one of the first and second LSBs.

17. The receiver of claim 13, wherein the compensation circuit includes:
a first post-cursor canceller configured to generate a first data signal and a first compensation reference level when the previous value of the output data corresponds to the fourth voltage level;
a second post-cursor canceller configured to generate a second data signal and second and third compensation reference levels when the previous value of the output data corresponds to the third voltage level;
a third post-cursor canceller configured to generate a third data signal and fourth and fifth compensation reference levels when the previous value of the output data corresponds to the second voltage level; and
a fourth post-cursor canceller configured to generate a fourth data signal and a sixth compensation reference level when the previous value of the output data corresponds to the first voltage level.

18. The receiver of claim 17, wherein the sampling circuit includes:
a first slicer configured to generate a first decision value by comparing the first data signal with the first compensation reference level;
a second slicer configured to generate second and third decision values by comparing the second data signal with the second and third compensation reference levels;
a third slicer configured to generate fourth and fifth decision values by comparing the third data signal with the fourth and fifth compensation reference levels; and
a fourth slicer configured to generate a sixth decision value by comparing the fourth data signal with the sixth compensation reference level.

19. The receiver of claim 18, wherein the output circuit includes:
a first multiplexer configured to output a first final decision value by selecting one of the first and second decision values;
a second multiplexer configured to output a second final decision value by selecting one of the third and fourth decision values;
a third multiplexer configured to output a third final decision value by selecting one of the fifth and sixth decision values; and
a decoder configured to generate MSB and LSB of the output data based on the first, second and third final decision values.

20. A receiver configured to receive a multi-level signal having a first voltage level, a second voltage level, a third voltage level, and a fourth voltage level that are different from each other, comprising:
a compensation circuit configured to compensate intersymbol interference (ISI) on an input data signal that is the multi-level signal, and including:
a first post-cursor canceller configured to generate a first data signal and first, second, and third compensation reference levels;
a second post-cursor canceller configured to generate a second data signal and fourth, fifth, and sixth compensation reference levels;
a third post-cursor canceller configured to generate a third data signal and seventh, eighth, and ninth compensation reference levels; and
a fourth post-cursor canceller configured to generate a fourth data signal and tenth, eleventh, and twelfth compensation reference levels;
a sampling circuit including:
a first slicer configured to generate first, second, and third decision values by comparing the first data signal with the first, second, and third compensation reference levels;
a second slicer configured to generate fourth, fifth, and sixth decision values by comparing the second data signal with the fourth, fifth, and sixth compensation reference levels;
a third slicer configured to generate seventh, eighth, and ninth decision values by comparing the third data signal with the seventh, eighth and ninth compensation reference levels; and
a fourth slicer configured to generate tenth, eleventh, and twelfth decision values by comparing the fourth data signal with the tenth, eleventh, and twelfth compensation reference levels;
an output circuit configured to generate output data based on the first through twelfth decision values, and to select a current value of the output data based on a previous value of the output data, the output data including a most significant bit (MSB) and a least significant bit (LSB); and
a mode selector configured to select one of a first operation mode and a second operation mode based on an operating environment,
wherein the first through fourth slicers are entirely enabled in the first operation mode, and the first through fourth slicers are partially enabled in the second operation mode.

* * * * *